(12) United States Patent
Shimizu

(10) Patent No.: US 10,955,443 B2
(45) Date of Patent: Mar. 23, 2021

(54) CURRENT SENSOR AND CURRENT SENSOR MODULE

(71) Applicant: Murata Manufacturing Co., Ltd., Nagaokakyo (JP)

(72) Inventor: Yasuhiro Shimizu, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 299 days.

(21) Appl. No.: 16/136,325

(22) Filed: Sep. 20, 2018

(65) Prior Publication Data

US 2019/0018046 A1 Jan. 17, 2019

Related U.S. Application Data

(63) Continuation of application No. PCT/JP2017/002488, filed on Jan. 25, 2017.

(30) Foreign Application Priority Data

Jun. 9, 2016 (JP) .............................. JP2016-115328

(51) Int. Cl.
*G01R 15/20* (2006.01)
*G01R 33/09* (2006.01)
(Continued)

(52) U.S. Cl.
CPC .............. *G01R 15/207* (2013.01); *G01R 7/02* (2013.01); *G01R 31/382* (2019.01); *G01R 33/02* (2013.01);
(Continued)

(58) Field of Classification Search
CPC .... G01R 15/20; G01R 15/202; G01R 15/205; G01R 15/207; G01R 33/02; G01R 33/06; G01R 33/072
See application file for complete search history.

(56) References Cited

U.S. PATENT DOCUMENTS 4,559,495 A 12/1985 Lienhard
4,749,939 A * 6/1988 Seitz ....................... H01F 38/30
324/117 H
(Continued)

FOREIGN PATENT DOCUMENTS

JP 2003-510612 A 3/2003
JP 2007-183221 A 7/2007
(Continued)

OTHER PUBLICATIONS

Official Communication issued in International Patent Application No. PCT/JP2017/002488, dated Apr. 25, 2017.

*Primary Examiner* — Walter L Lindsay, Jr.
*Assistant Examiner* — Milton Gonzalez
(74) *Attorney, Agent, or Firm* — Keating & Bennett, LLP

(57) ABSTRACT

A current sensor includes a conductor through which current to be measured flows and which has dimensions in a length direction, a width direction, and a height direction, and first and second magnetic sensors that detect the strength of a magnetic field generated by the current. Each of the first and second magnetic sensors is positioned in an area between first and second conductor portions in the width direction and an area extending from one end to the other end in the height direction of the first and second conductor portions.

20 Claims, 18 Drawing Sheets

(51) Int. Cl.
  *G01R 33/06* (2006.01)
  *G01R 33/07* (2006.01)
  *G01R 31/382* (2019.01)
  *G01R 7/02* (2006.01)
  *G01R 33/02* (2006.01)
  *G01R 19/10* (2006.01)
  *G01R 19/00* (2006.01)

(52) U.S. Cl.
  CPC ......... *G01R 33/063* (2013.01); *G01R 33/072* (2013.01); *G01R 33/096* (2013.01); *G01R 15/20* (2013.01); *G01R 15/202* (2013.01); *G01R 19/0092* (2013.01); *G01R 19/10* (2013.01)

(56) References Cited

U.S. PATENT DOCUMENTS

| | | | | |
|---|---|---|---|---|
| 4,810,989 | A * | 3/1989 | Brandenberg | G01R 15/18 336/84 M |
| 6,459,255 | B1 * | 10/2002 | Tamai | G01R 15/202 324/117 H |
| 6,512,359 | B1 * | 1/2003 | Tamai | G01R 15/207 324/117 H |
| 6,940,265 | B2 * | 9/2005 | Hauenstein | G01R 15/207 324/117 H |
| 8,217,643 | B2 * | 7/2012 | Kuroki | G01R 15/207 324/117 H |
| 9,134,351 | B2 * | 9/2015 | Juds | G01R 33/072 |
| 9,846,180 | B2 * | 12/2017 | Juds | H01H 33/027 |
| 2010/0045286 | A1 | 2/2010 | Hotz et al. | |
| 2016/0033557 | A1 * | 2/2016 | Hwangbo | G01R 15/207 324/76.11 |

FOREIGN PATENT DOCUMENTS

| | | |
|---|---|---|
| JP | 2009-222696 A | 10/2009 |
| JP | 2010-048809 A | 3/2010 |
| JP | 2015-036636 A | 2/2015 |
| JP | 2015-132534 A | 7/2015 |
| JP | 2015-184175 A | 10/2015 |
| JP | 2016-099111 A | 5/2016 |

* cited by examiner

CURRENT SENSOR AND CURRENT SENSOR MODULE

CROSS REFERENCE TO RELATED APPLICATIONS

This application claims the benefit of priority to Japanese Patent Application No. 2016-115328 filed on Jun. 9, 2016 and is a Continuation Application of PCT Application No. PCT/JP2017/002488 filed on Jan. 25, 2017. The entire contents of each application are hereby incorporated herein by reference.

BACKGROUND OF THE INVENTION

1. Field of the Invention

The present invention relates to a current sensor and a current sensor module.

2. Description of the Related Art

Japanese Unexamined Patent Application Publication No. 2010-48809 is an example in the related art disclosing the configurations of current sensors. In a current sensor according to a first preferred embodiment described in Japanese Unexamined Patent Application Publication No. 2010-48809, a conductor is composed of a first conductor portion and a second conductor portion. The first conductor portion and the second conductor portion are spaced from each other. An intermediate space is formed between the first conductor portion and the second conductor portion. Since a support in which a magnetic sensor is provided is inserted into the intermediate space, the magnetic sensor is disposed in the magnetic field of the conductor and outside the intermediate space.

In a current sensor according to a second preferred embodiment described in Japanese Unexamined Patent Application Publication No. 2010-48809, a conductor has multiple bends. The conductor includes a first conductor portion element, a second conductor portion element, and a third conductor portion element, which are disposed so as to be spaced from each other. A first magnetic sensor is disposed between the first conductor portion element and the second conductor portion element. A second magnetic sensor is disposed between the second conductor portion element and the third conductor portion element.

Since the conductor is branched to the first conductor portion and the second conductor portion in the current sensor according to the first preferred embodiment disclosed in Japanese Unexamined Patent Application Publication No. 2010-48809, current flowing through the conductor is divided into a portion flowing through the first conductor portion and a portion flowing through the second conductor portion. Accordingly, the strength of the magnetic field occurring around the first conductor portion and the strength of the magnetic field occurring around the second conductor portion are smaller than the strength of the magnetic field occurring around a portion of the conductor that is not branched. As a result, since the strength of the magnetic field applied to the magnetic sensor is small, the output from the magnetic sensor is decreased to decrease the sensitivity of the current sensor.

Since the second conductor portion element is positioned between the first magnetic sensor and the second magnetic sensor in the current sensor according to the second preferred embodiment described in Japanese Unexamined Patent Application Publication No. 2010-48809, the distance between the first magnetic sensor and the second magnetic sensor is made long. When the distance between the first magnetic sensor and the second magnetic sensor is long, the difference between the strength of an external magnetic field applied to the first magnetic sensor and the strength of an external magnetic field applied to the second magnetic sensor is increased. Accordingly, the variation in the measurement value by the current sensor, which is caused by the external magnetic field, is increased.

SUMMARY OF THE INVENTION

Preferred embodiments of the present invention provide current sensors and current sensor modules, each of which has a high sensitivity to the magnetic field generated by current to be measured and a small variation in the measurement value due to the external magnetic field.

A current sensor according to a preferred embodiment of the present invention includes a conductor through which current to be measured flows and which has dimensions in a length direction, a width direction orthogonal or substantially orthogonal to the length direction, and a height direction orthogonal or substantially orthogonal to the length direction and the width direction; and a first magnetic sensor and a second magnetic sensor that detect a strength of a magnetic field generated by the current. The conductor includes a first conductor portion that extends in the length direction and that includes a first end portion and a second end portion in the length direction, a second conductor portion that extends in the length direction and is spaced apart from the first conductor portion in the width direction and that includes a third end portion and a fourth end portion in the length direction, and a third conductor portion that is positioned between the first conductor portion and the second conductor portion, viewed from the height direction, that is positioned at one side of the height direction with respect to the first conductor portion and the second conductor portion, viewed from the length direction, and that includes a fifth end portion and a sixth end portion in the length direction. The sixth end portion is connected to the second end portion. The fifth end portion is connected to the third end portion. Each of the first magnetic sensor and the second magnetic sensor is positioned in an area between the first conductor portion and the second conductor portion in the width direction and an area including one end to another end in the height direction of both of the first conductor portion and the second conductor portion.

In a current sensor according to a preferred embodiment of the present invention, a shortest distance between the first magnetic sensor and the first conductor portion is shorter than a shortest distance between the first magnetic sensor and the second conductor portion. A shortest distance between the second magnetic sensor and the second conductor portion is shorter than a shortest distance between the second magnetic sensor and the first conductor portion.

In a current sensor according to a preferred embodiment of the present invention, a shortest distance between the first magnetic sensor and the first conductor portion is shorter than a shortest distance between the first magnetic sensor and the third conductor portion. The shortest distance between the second magnetic sensor and the second conductor portion is shorter than a shortest distance between the second magnetic sensor and the third conductor portion.

In a current sensor according to a preferred embodiment of the present invention, the current sensor further includes a calculator that performs an arithmetic operation of a value detected by the first magnetic sensor and a value detected by the second magnetic sensor to calculate a value of the current. The phase of the value of the magnetic field, detected by the first magnetic sensor, is opposite to the phase of the value of the magnetic field, detected by the second magnetic sensor. The calculator is a subtractor or a differential amplifier, for example.

In a current sensor according to a preferred embodiment of the present invention, the current sensor further includes a calculator that performs an arithmetic operation of a value detected by the first magnetic sensor and a value detected by the second magnetic sensor to calculate a value of the current. The value of the magnetic field, detected by the first magnetic sensor, is in phase with the value of the magnetic field, detected by the second magnetic sensor. The calculator is an adder or a summing amplifier, for example.

In a current sensor according to a preferred embodiment of the present invention, each of the first conductor portion and the second conductor portion has a plate shape. When viewed from the length direction, a first virtual plane including a surface of the first conductor portion at the second conductor portion side and a second virtual plane including a surface of the second conductor portion at the first conductor portion side are parallel or substantially parallel to each other.

In a current sensor according to a preferred embodiment of the present invention, a portion of the first conductor portion and a portion of the second conductor portion are opposed to each other.

In a current sensor according to a preferred embodiment of the present invention, when viewed from the width direction, a position of the first conductor portion is shifted from a position of the second conductor portion in the height direction.

In a current sensor according to a preferred embodiment of the present invention, each of the first conductor portion and the second conductor portion has a plate shape. When viewed from the length direction, a first virtual plane including a surface of the first conductor portion at the second conductor portion side and a second virtual plane including a surface of the second conductor portion at the first conductor portion side intersect with each other.

In a current sensor according to a preferred embodiment of the present invention, the third conductor portion extends in the length direction.

In a current sensor according to a preferred embodiment of the present invention, the third conductor portion extends in the length direction and the width direction.

In a current sensor according to a preferred embodiment of the present invention, the third conductor portion has a plate shape.

In a current sensor according to a preferred embodiment of the present invention, when viewed from the length direction, the third conductor portion has a shape in which the third conductor portion is convexly bent toward a side opposite to the first conductor portion side in the height direction.

In a current sensor according to a preferred embodiment of the present invention, the convexly bent shape is a curved shape.

In a current sensor according to a preferred embodiment of the present invention, the convexly bent shape is a flex shape.

In a current sensor according to a preferred embodiment of the present invention, the current sensor further includes a substrate on which the first magnetic sensor and the second magnetic sensor are mounted and a housing in which the substrate is housed. The housing is fixed to the conductor.

In a current sensor according to a preferred embodiment of the present invention, the housing is in contact with the first conductor portion, the second conductor portion, and the third conductor portion.

A current sensor module according to a preferred embodiment of the present invention includes a current sensor according to a preferred embodiment of the present invention. The current sensor includes multiple current sensors. The conductors in the respective multiple current sensors are parallel or substantially parallel to each other.

In a current sensor module according to a preferred embodiment of the present invention, the multiple current sensors are spaced apart from each other in the height direction. In adjacent current sensors, the area between the first conductor portion and the second conductor portion in the width direction in one current sensor is opposed to the third conductor portion in the other current sensor.

In a current sensor module according to a preferred embodiment of the present invention, the multiple current sensors are spaced apart from each other in the length direction and are spaced apart from each other in the width direction. In adjacent current sensors, the area between the first conductor portion and the second conductor portion in the width direction in one current sensor is opposed in the length direction to the area between the first conductor portion and the second conductor portion in the width direction in the other current sensor.

According to various preferred embodiments of the present invention, in current sensors, it is possible to reduce the variation in a measured value due to an external magnetic field while increasing the sensitivity to a magnetic field generated by current to be measured.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
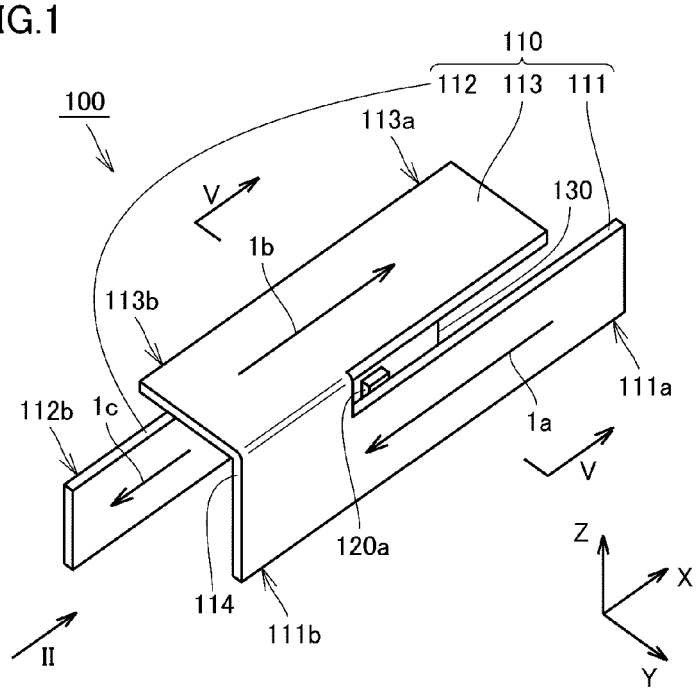
FIG. 1 is a perspective view illustrating the external appearance of a current sensor according to a first preferred embodiment of the present invention.

Current sensors and current sensor modules according to preferred embodiments of the present invention will be described with reference to the drawings. The same reference numerals are used to identify the same components or the corresponding components in the drawings in the description of the preferred embodiments described below and a duplicated description of such components is omitted herein.

First Preferred Embodiment

Figure 2:
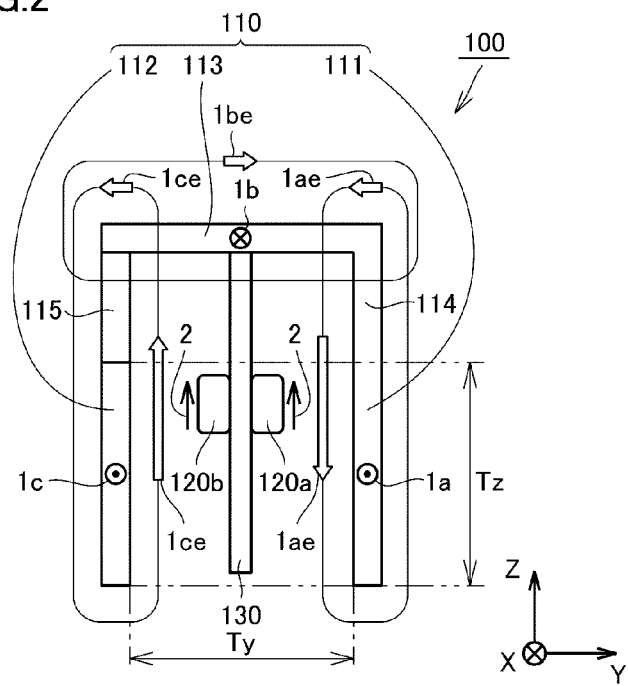
FIG. 2 is a front view of the current sensor in FIG. 1, viewed from the direction of an arrow II.
Figure 3:
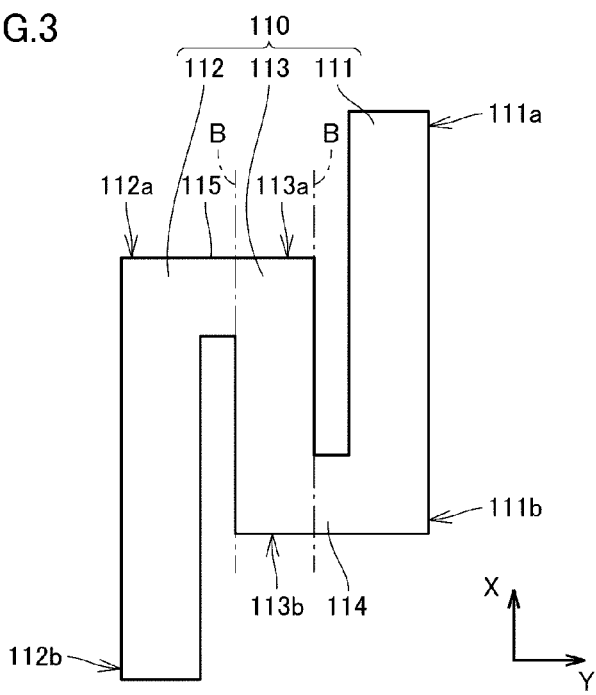
FIG. 3 is a developed view illustrating the shape of a conductor in the current sensor according to the first preferred embodiment of the present invention, before the conductor is folded.
Figure 4:
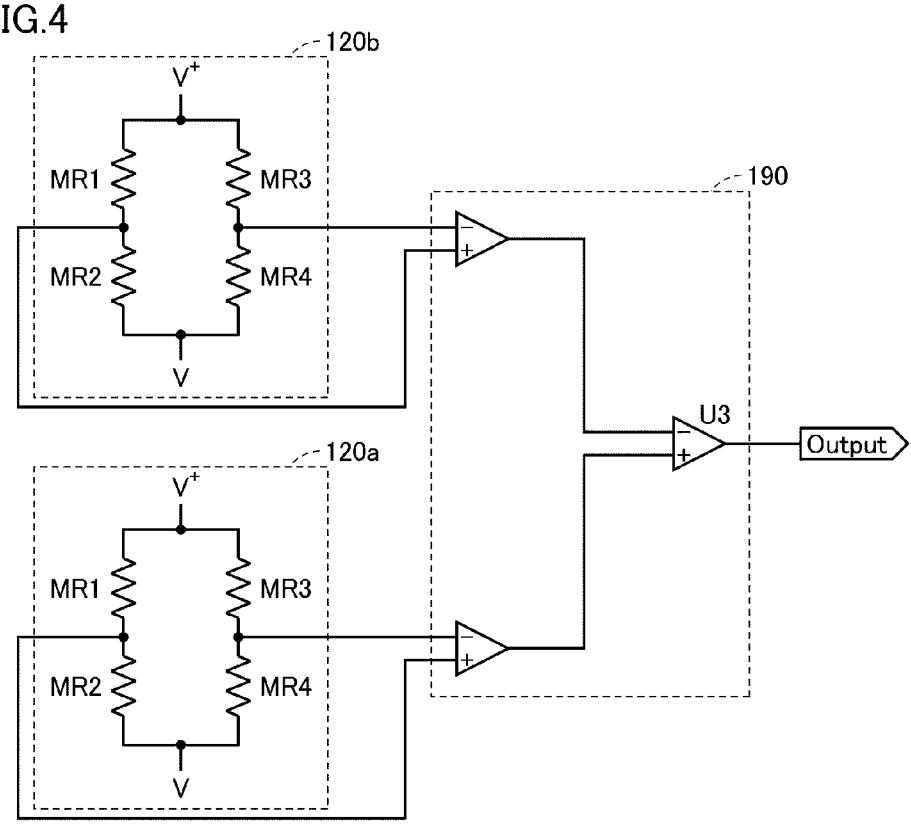
FIG. 4 is a circuit diagram illustrating the circuit configuration of the current sensor according to the first preferred embodiment of the present invention.

FIG. 1 is a perspective view illustrating the external appearance of a current sensor according to a first preferred embodiment of the present invention. FIG. 2 is a front view of the current sensor in FIG. 1, viewed from the direction of an arrow II. FIG. 3 is a developed view illustrating the shape of a conductor in the current sensor according to the first preferred embodiment of the present invention, before the conductor is folded. FIG. 4 is a circuit diagram illustrating the circuit configuration of the current sensor according to the first preferred embodiment of the present invention. The length direction of the conductor is indicated as the X-axis direction, the width direction of the conductor is indicated as the Y-axis direction, and the height direction of the conductor is indicated as the Z-axis direction in FIG. 1 to FIG. 3.

As illustrated in FIG. 1 to FIG. 3, a current sensor 100 according to the first preferred embodiment of the present invention includes a conductor 110, a first magnetic sensor 120a, and a second magnetic sensor 120b. Current to be measured flows through the conductor 110. The conductor 110 has dimensions in the length direction (the X-axis direction), the width direction (the Y-axis direction) orthogonal or substantially orthogonal to the length direction (the X-axis direction), and the height direction (the Z-axis direction) orthogonal or substantially orthogonal to the length direction (the X-axis direction) and the width direction (the Y-axis direction). The first magnetic sensor 120a and the second magnetic sensor 120b detect the strength of a magnetic field generated by the current.

The conductor 110 includes a first conductor portion 111, a second conductor portion 112, and a third conductor portion 113. The first conductor portion 111 extends in the length direction (the X-axis direction) and includes a first end portion 111a and a second end portion 111b in the length direction (the X-axis direction). The second conductor portion 112 extends in the length direction (the X-axis direction) and is spaced apart from the first conductor portion 111 in the width direction (the Y-axis direction) and includes a third end portion 112a and a fourth end portion 112b in the length direction (the X-axis direction). The third conductor portion 113 is positioned between the first conductor portion 111 and the second conductor portion 112, viewed from the height direction (the Z-axis direction), is positioned at one side of the height direction (the Z-axis direction) with respect to the first conductor portion 111 and the second conductor portion 112, viewed from the length direction (the X-axis direction), and includes a fifth end portion 113*a* and a sixth end portion 113*b* in the length direction (the X-axis direction).

Connection of the sixth end portion 113*b* to one end of the second end portion 111*b* in the height direction (the Z-axis direction) causes the first conductor portion 111 and the third conductor portion 113 to be connected to each other. Specifically, the second end portion 111*b* and the sixth end portion 113*b* are connected to each other with a fourth conductor portion 114 disposed therebetween. The fourth conductor portion 114 is a portion of the conductor 110. The fourth conductor portion 114 extends in the height direction (the Z-axis direction).

Connection of the fifth end portion 113*a* to one end of the third end portion 112*a* in the height direction (the Z-axis direction) causes the second conductor portion 112 and the third conductor portion 113 to be connected to each other. Specifically, the third end portion 112*a* and the fifth portion 113*a* are connected to each other with a fifth conductor portion 115 disposed therebetween. The fifth conductor portion 115 is a portion of the conductor 110. The fifth conductor portion 115 extends in the height direction (the Z-axis direction).

In the present preferred embodiment, each of the first conductor portion 111 and the second conductor portion 112 preferably has a plate shape, for example. When viewed from the length direction (the X-axis direction), a first virtual plane including a surface of the first conductor portion 111 at the second conductor portion 112 side and a second virtual plane including a surface of the second conductor portion 112 at the first conductor portion 111 side are preferably parallel or substantially parallel to each other, for example. A portion of the first conductor portion 111 and a portion of the second conductor portion 112 are opposed to each other in the width direction (the Y-axis direction). A portion of the first conductor portion 111 and a portion of the second conductor portion 112 are overlapped with each other in the height direction (the Z-axis direction), when viewed from the width direction (the Y-axis direction). The third conductor portion 113 extends in the length direction (the X-axis direction). The third conductor portion 113 preferably has a plate shape, for example.

As illustrated in FIG. 3, the conductor 110 before being folded includes the first conductor portion 111, the second conductor portion 112, and the third conductor portion 113, which extend in the length direction (the X-axis direction) while being spaced from each other in the width direction (the Y-axis direction). The conductor 110 before being folded further includes the fourth conductor portion 114, which extends in the width direction (the Y-axis direction) and with which the first conductor portion 111 is connected to the third conductor portion 113. The conductor 110 before being folded further includes the fifth conductor portion 115, which extends in the width direction (the Y-axis direction) and with which the second conductor portion 112 is connected to the third conductor portion 113.

In the conductor 110 before being folded, the first conductor portion 111, the second conductor portion 112, and the third conductor portion 113 preferably have the same or substantially the same dimension in the width direction (the Y-axis direction). The entire conductor 110 preferably has a uniform or substantially uniform thickness. Accordingly, the area of a flow path through which the current flows is constant or substantially constant in the first conductor portion 111, the second conductor portion 112, and the third conductor portion 113. The dimension in the width direction (the Y-axis direction) of the third conductor portion 113 may be smaller than the dimensions in the width direction (the Y-axis direction) of the first conductor portion 111 and the second conductor portion 112.

In the present preferred embodiment, the conductor 110 is preferably made of copper, for example. However, the material of the conductor 110 is not limited to this. The conductor 110 may be made of metal, such as silver, aluminum, or iron, or alloy including any of these metals, for example.

The conductor 110 may be subjected to surface treatment. For example, at least one plated layer made of metal, such as nickel, tin, silver, or copper, or alloy including any of these metals may be provided on the surface of the conductor 110.

In the present preferred embodiment, the conductor 110 is formed through press working, for example. The conductor 110 before being folded is folded along two folds B illustrated in FIG. 3 resulting in the conductor 110 having the shape illustrated in FIG. 1 and FIG. 2. The two folds B are positioned on both ends of the third conductor portion 113 in the width direction (the Y-axis direction). Specifically, the conductor 110 is subjected to the press working along the two folds B to cause each of the fourth conductor portion 114 and the fifth conductor portion 115 to be bent such that the external surface side of each of the fourth conductor portion 114 and the fifth conductor portion 115 is more extended than the inner surface side thereof, thus providing the conductor 110 having the shape illustrated in FIG. 1 and FIG. 2. However, the method of forming the conductor 110 is not limited to this and the conductor 110 may be formed through cutting work or casting.

As illustrated in FIG. 1 and FIG. 2, the first magnetic sensor 120*a* and the second magnetic sensor 120*b* are mounted on one substrate 130 in the present preferred embodiment. The substrate 130 is a printed wiring board and preferably includes, for example, a base material made of an electrical insulation material, such as glass epoxy or alumina, and wiring that is provided on the surface of the base material and that is formed by patterning a metallic foil made of, for example, copper. The thickness of the substrate 130 is preferably, for example, about 1.6 mm.

The first magnetic sensor 120*a* is mounted on one main surface of the substrate 130. The second magnetic sensor 120*b* is mounted on the other main surface of the substrate 130. Each of the first magnetic sensor 120*a* and the second magnetic sensor 120*b* is mounted on the substrate 130 along with electronic components including an amplifier and a passive element. The electronic components, such as the amplifier and the passive element, define an arithmetic circuit that performs an arithmetic operation of signals from the first magnetic sensor 120*a* and the second magnetic sensor 120*b*. The amplifier and the passive element are not illustrated in FIG. 1 and FIG. 2. However, the amplifier and the passive element may be mounted on a different substrate from the substrate 130 on which the first magnetic sensor 120*a* and the second magnetic sensor 120*b* are mounted.

As illustrated in FIG. 2, the one main surface of the substrate 130 is preferably parallel or substantially parallel to the surface of the first conductor portion 111 at the second conductor portion 112 side. The other main surface of the substrate 130 is preferably parallel or substantially parallel to the surface of the second conductor portion 112 at the first conductor portion 111 side. The substrate 130 is disposed at an intermediate position between the surface of the first conductor portion 111 at the second conductor portion 112 side and the surface of the second conductor portion 112 at the first conductor portion 111 side in the width direction (the Y-axis direction).

Each of the first magnetic sensor 120a and the second magnetic sensor 120b is positioned in an area Ty between the first conductor portion 111 and the second conductor portion 112 in the width direction (the Y-axis direction) and an area Tz extending from one end to the other end in the height direction (the Z-axis direction) of both the first conductor portion 111 and the second conductor portion 112. The area Ty extends from the position of the third end portion 112a of the second conductor portion 112 to the position of the second end portion 111b of the first conductor portion 111 in the length direction (the X-axis direction).

The shortest distance between the first magnetic sensor 120a and the first conductor portion 111 is shorter than the shortest distance between the first magnetic sensor 120a and the second conductor portion 112. The shortest distance between the second magnetic sensor 120b and the second conductor portion 112 is shorter than the shortest distance between the second magnetic sensor 120b and the first conductor portion 111.

The shortest distance between the first magnetic sensor 120a and the first conductor portion 111 is shorter than the shortest distance between the first magnetic sensor 120a and the third conductor portion 113. The shortest distance between the second magnetic sensor 120b and the second conductor portion 112 is shorter than the shortest distance between the second magnetic sensor 120b and the third conductor portion 113.

Each of the first magnetic sensor 120a and the second magnetic sensor 120b includes a detection axis 2 and is disposed such that the detection axis 2 extends in the height direction (the Z-axis direction).

Each of the first magnetic sensor 120a and the second magnetic sensor 120b has odd function input-output characteristics in which a positive value is output when the magnetic field directed to one direction of the detection axis 2 is detected and a negative value is output when the magnetic field directed to a direction opposite to the one direction of the detection axis 2 is detected.

As illustrated in FIG. 4, in the current sensor 100 according to the present preferred embodiment, each of the first magnetic sensor 120a and the second magnetic sensor 120b preferably includes a Wheatstone bridge circuit including four anisotropic magneto resistance (AMR) elements, for example. Each of the first magnetic sensor 120a and the second magnetic sensor 120b may include magnetoresistive elements, such as giant magneto resistance (GMR) elements, tunnel magneto resistance (TMR) elements, ballistic magneto resistance (BMR) elements, or colossal magneto resistance (CMR) elements, for example, instead of the AMR elements.

Each of the first magnetic sensor 120a and the second magnetic sensor 120b may include a half-bridge circuit including two magnetoresistive elements. Alternatively, for example, a magnetic sensor including Hall elements, or a magnetic sensor or a flux gate magnetic sensor including magneto impedance (MI) elements using magnetoimpedance effect may be used as the first magnetic sensor 120a and the second magnetic sensor 120b. The magnetic elements, such as the magnetoresistive elements or the Hall elements, may preferably be packaged with resin or may be potted with silicone resin or epoxy resin, for example.

When multiple magnetic elements are packaged, the multiple magnetic elements may be housed in one package or may be separately packaged. Alternatively, the multiple magnetic elements may be housed on one package such that the multiple magnetic elements and the electronic components are integrated.

In the present preferred embodiment, the AMR element has the odd function input-output characteristics by including a barber pole electrode. Specifically, each magnetoresistive element in each of the first magnetic sensor 120a and the second magnetic sensor 120b is biased so that the current flows in a direction having a predetermined angle with respect to the magnetization direction of a magnetoresistive film in the magnetoresistive element due to the inclusion of the barber pole electrode. The magnetoresistive film preferably includes a thin film made of a magnetic material, such as Permalloy, for example.

The magnetization direction of the magnetoresistive film depends on the shape anisotropy of the magnetoresistive film. The method of adjusting the magnetization direction of the magnetoresistive film is not limited to the method of using the shape anisotropy of the magnetoresistive film. A method of disposing a permanent magnet near the magnetoresistive film including the AMR element or a method of providing exchange coupling in the magnetoresistive film including the AMR element may be used to adjust the magnetization direction of the magnetoresistive film.

The permanent magnet may be a sintered magnet, a bonded magnet, or a thin film, for example. The kind of the permanent magnet is not particularly limited and, for example, an isotropic ferrite magnet, an anisotropic ferrite magnet, a samarium-cobalt magnet, an alnico magnet, or a neodymium magnet may be used.

The magnetoresistive film may be provided on the permanent magnet. When viewed from a direction orthogonal or substantially orthogonal to the main surface of the substrate 130, the magnetoresistive film may be sandwiched between the permanent magnets or the permanent magnet may be sandwiched between the magnetoresistive films. Application of a bias magnetic field to the multiple magnetoresistive films with one permanent magnet enables each of the first magnetic sensor 120a and the second magnetic sensor 120b to be reduced in size.

The magnetization direction of the magnetoresistive film in the magnetoresistive element in the first magnetic sensor 120a is the same or substantially the same as the magnetization direction of the magnetoresistive film in the magnetoresistive element in the second magnetic sensor 120b. Accordingly, it is possible to reduce a decrease in the output accuracy, which is caused by the influence of an external magnetic field.

As illustrated in FIG. 4, the current sensor 100 further includes a calculator 190 that performs an arithmetic operation of a value detected by the first magnetic sensor 120a and a value detected by the second magnetic sensor 120b to calculate the value of the current to be measured flowing through the conductor 110. In the present preferred embodiment, the calculator 190 is preferably a differential amplifier, for example. The calculator 190 may be a subtractor, for example.

The operation of the current sensor 100 according to the first preferred embodiment of the present invention will now be described. The current to be measured flows through the conductor 110 to cause current 1a to flow through the first conductor portion 111 from the first end portion 111a side to the second end portion 111b side in the length direction (the X-axis direction), as illustrated in FIG. 1 and FIG. 2. The current 1a enters the sixth end portion 113b of the third conductor portion 113 connected to the fourth conductor portion 114 via the fourth conductor portion 114 connected to the first conductor portion 111. The current, which has entered the sixth end portion 113*b* of the third conductor portion 113, flows through the third conductor portion 113 from the sixth end portion 113*b* side to the fifth end portion 113*a* side in the length direction (the X-axis direction) as current 1*b* . The current 1*b* enters the third end portion 112*a* of the second conductor portion 112 connected to the fifth conductor portion 115 via the fifth conductor portion 115 connected to the third conductor portion 113. The current, which has entered the third end portion 112*a* of the second conductor portion 112, flows through the second conductor portion 112 from the third end portion 112*a* side to the fourth end portion 112*b* side in the length direction (the X-axis direction) as current 1*c*.

As illustrated in FIG. 2, according to the right-handed screw rule, a magnetic field 1*ae* that extends around the first conductor portion 111 occurs, a magnetic field 1*ce* that extends around the second conductor portion 112 occurs, and a magnetic field 1*be* that extends around the third conductor portion 113 occurs.

As described above, the first magnetic sensor 120*a* is positioned toward the first conductor portion 111 in the area Ty and the area Tz. Accordingly, the magnetic field 1*ae* around the first conductor portion 111 is mainly applied to the first magnetic sensor 120*a*. The second magnetic sensor 120*b* is positioned toward the second conductor portion 112 in the area Ty and the area Tz. Accordingly, the magnetic field 1*ce* around the second conductor portion 112 is mainly applied to the second magnetic sensor 120*b*.

The magnetic field 1*be* around the third conductor portion 113 is mainly applied to each of the first magnetic sensor 120*a* and the second magnetic sensor 120*b* in the width direction (the Y-axis direction) orthogonal or substantially orthogonal to the height direction (the Z-axis direction) to which the detection axis 2 is directed. Accordingly, each of the first magnetic sensor 120*a* and the second magnetic sensor 120*b* hardly detects the magnetic field 1*be* around the third conductor portion 113.

Figure 5:
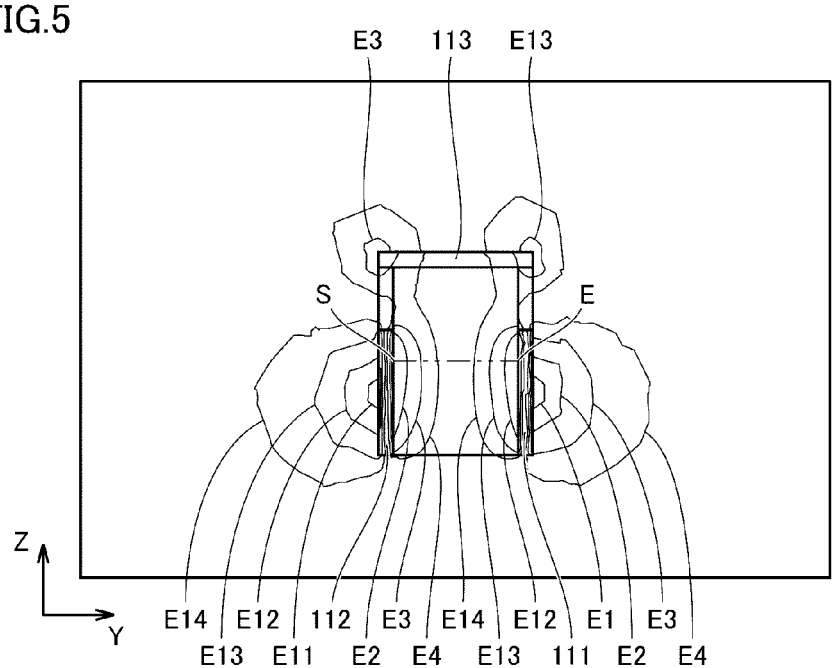
FIG. 5 is a contour map illustrating a result of simulation analysis of the distribution of magnetic flux density of a magnetic field occurring around the conductor in the current sensor according to the first preferred embodiment of the present invention.
Figure 6:
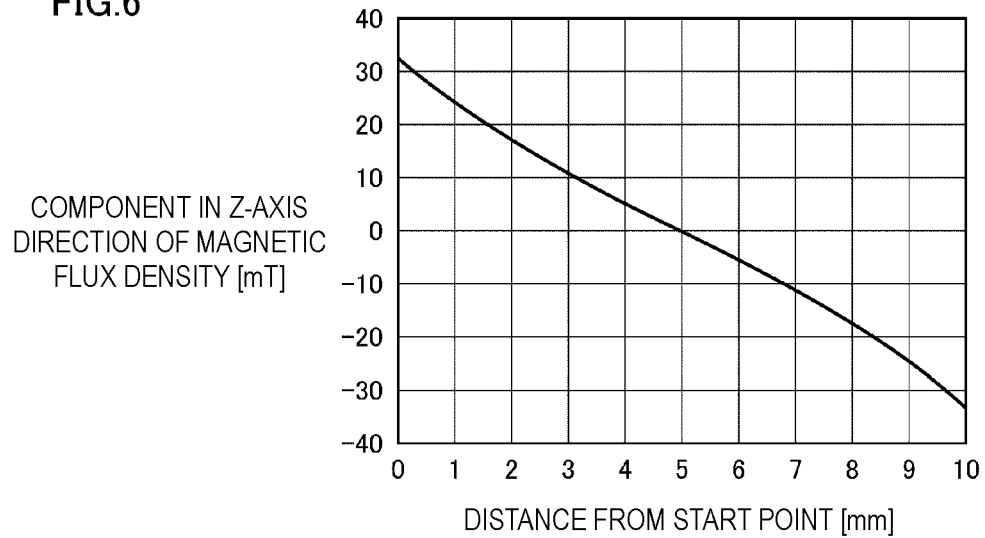
FIG. 6 is a graph illustrating the relationship between the component (mT) in the Z-axis direction of the magnetic flux density and the distance (mm) from a start point S on a virtual straight line that extends in the Y-axis direction from the start point S to an end point E in FIG. 5.

FIG. 5 is a contour map illustrating a result of simulation analysis of the distribution of the magnetic flux density of the magnetic field occurring around the conductor in the current sensor according to the first preferred embodiment of the present invention. A cross-sectional view of the current sensor in FIG. 1 is illustrated in FIG. 5, viewed from the direction of a V-V line. FIG. 6 is a graph illustrating the relationship between the component (mT) in the Z-axis direction of the magnetic flux density and the distance (mm) from a start point S on a virtual straight line that extends in the Y-axis direction from the start point S to an end point E in FIG. 5.

In the simulation analysis, in the cross-sectional dimensions of each of the first conductor portion 111, the second conductor portion 112, and the third conductor portion 113, the width was set to about 10 mm and the thickness was set to about 1.5 mm. The position of the virtual straight line in the height direction (the Z-axis direction) was set to a position about 7.5 mm apart from one end in the height direction (the Z-axis direction) of each of the first conductor portion 111 and the second conductor portion 112. The value of the current flowing through the first conductor portion 111, the second conductor portion 112, and the third conductor portion 113 was set to about 600 A.

Referring to FIG. 5, a line in which the component in the height direction (the Z-axis direction) of the magnetic flux density is set to about 40 mT is denoted by E1, a line in which the component in the height direction (the Z-axis direction) of the magnetic flux density is set to about 32 mT is denoted by E2, a line in which the component in the height direction (the Z-axis direction) of the magnetic flux density is set to about 24 mT is denoted by E3, and a line in which the component in the height direction (the Z-axis direction) of the magnetic flux density is set to about 16 mT is denoted by E4. A line in which the component in the height direction (the Z-axis direction) of the magnetic flux density is set to about −40 mT is denoted by E11, a line in which the component in the height direction (the Z-axis direction) of the magnetic flux density is set to about −32 mT is denoted by E12, a line in which the component in the height direction (the Z-axis direction) of the magnetic flux density is set to about −24 mT is denoted by E13, and a line in which the component in the height direction (the Z-axis direction) of the magnetic flux density is set to about −16 mT is denoted by E14. As for the components in the height direction (the Z-axis direction) of the magnetic flux density, each upward magnetic flux in FIG. 5 is indicated by a positive value and each downward magnetic flux in FIG. 5 is indicated by a negative value.

As illustrated in FIG. 6, the signs of the components in the height direction (the Z-axis direction) of the magnetic flux density were reversed from a position about 5 mm apart from the start point, which is an intermediate point between the start point S and the end point E on the virtual straight line. Specifically, the components in the height direction (the Z-axis direction) of the magnetic flux density had positive values at positions the distances from the start point to which are shorter than about 5 mm and the components in the height direction (the Z-axis direction) of the magnetic flux density had negative values at positions the distances from the start point to which are longer than about 5 mm.

The first magnetic sensor 120*a* is disposed at a position the distance from the start point to which is longer than about 5 mm on the virtual straight line. The second magnetic sensor 120*b* is disposed at a position the distance from the start point to which is shorter than about 5 mm on the virtual straight line.

Accordingly, the orientation of the magnetic flux of the magnetic field 1*ae* applied to the first magnetic sensor 120*a* is opposite to the orientation of the magnetic flux of the magnetic field 1*be* applied to the second magnetic sensor 120*b*, and the orientation of the detection axis 2 of the first magnetic sensor 120*a* is the same as the orientation of the detection axis 2 of the second magnetic sensor 120*b*. Consequently, in terms of the strength of the magnetic field generated by the current to be measured flowing through the conductor 110, the phase of the value detected by the first magnetic sensor 120*a* is opposite to the phase of the value detected by the second magnetic sensor 120*b*. As a result, when the strength of the magnetic field detected by the first magnetic sensor 120*a* is set to a positive value, the strength of the magnetic field detected by the second magnetic sensor 120*b* has a negative value.

The arithmetic operation of the value detected by the first magnetic sensor 120*a* and the value detected by the second magnetic sensor 120*b* is performed by the calculator 190. Specifically, the calculator 190 subtracts the value detected by the second magnetic sensor 120*b* from the value detected by the first magnetic sensor 120*a*. The value of the current to be measured that flowed through the conductor 110 is calculated from the result of the subtraction.

Since the substrate 130 is positioned between the first magnetic sensor 120*a* and the second magnetic sensor 120*b* in the current sensor 100 according to the present preferred embodiment, an external magnetic field source is not capable of being physically positioned between the first magnetic sensor 120a and the second magnetic sensor 120b.

Accordingly, the orientation of the magnetic field component in the direction of the detection axis 2, in the magnetic field applied from the external magnetic field source to the first magnetic sensor 120a, is the same as the orientation of the magnetic field component in the direction of the detection axis 2, in the magnetic field applied from the external magnetic field source to the second magnetic sensor 120b. Accordingly, when the strength of the external magnetic field detected by the first magnetic sensor 120a is set to a positive value, the strength of the external magnetic field detected by the second magnetic sensor 120b also has a positive value.

As a result, the subtraction of the value detected by the second magnetic sensor 120b from the value detected by the first magnetic sensor 120a by the calculator 190 causes the magnetic field from the external magnetic field source to be hardly detected. In other words, the influence of the external magnetic field is reduced.

As a modification of the present preferred embodiment, the direction of the detection axis 2, in which the value detected by the first magnetic sensor 120a is a positive value, may be opposite to the direction of the detection axis 2, in which the value detected by the second magnetic sensor 120b is a positive value (the direction of the detection axis 2, in which the value detected by the first magnetic sensor 120a is a positive value, may be about 180 degrees different from the direction of the detection axis 2, in which the value detected by the second magnetic sensor 120b is a positive value). In this case, when the strength of the external magnetic field detected by the first magnetic sensor 120a is set to a positive value, the strength of the external magnetic field detected by the second magnetic sensor 120b has a negative value.

In contrast, in terms of the strength of the magnetic field generated by the current to be measured flowing through the conductor 110, the value detected by the first magnetic sensor 120a is in phase with the value detected by the second magnetic sensor 120b.

In this modification, an adder or a summing amplifier is used, instead of the differential amplifier, as the calculator 190. In terms of the strength of the external magnetic field, the value detected by the first magnetic sensor 120a is added to the value detected by the second magnetic sensor 120b with the adder or the summing amplifier to perform the subtraction using the absolute value of the value detected by the first magnetic sensor 120a and the absolute value of the value detected by the second magnetic sensor 120b. This causes the magnetic field from the external magnetic field source to be hardly detected. In other words, the influence of the external magnetic field is reduced.

In contrast, in terms of the strength of the magnetic field generated by the current flowing through the conductor 110, the value detected by the first magnetic sensor 120a is added to the value detected by the second magnetic sensor 120b with the adder or the summing amplifier to calculate the value of the current to be measured that flowed through the conductor 110.

Instead of the differential amplifier, the adder or the summing amplifier may be used as the calculator in the above manner while the polarity of the input-output characteristics of the first magnetic sensor 120a is made opposite to the polarity of the input-output characteristics of the second magnetic sensor 120b.

As described above, in the current sensor 100 according to the present preferred embodiment, the conductor 110 is not branched, the magnetic field 1ae generated by the flowing of the current 1a to be measured through the first conductor portion 111 is detected by the first magnetic sensor 120a, and the magnetic field 1ce generated by the flowing of the current 1c to be measured through the second conductor portion 112 is detected by the second magnetic sensor 120b. With the above-described configuration, it is possible to maintain the output from each of the first magnetic sensor 120a and the second magnetic sensor 120b to a high level in order to increase the sensitivity of the current sensor 100.

In addition, since the first magnetic sensor 120a and the second magnetic sensor 120b are able to be disposed close to each other, it is possible to decrease the difference between the strength of the external magnetic field applied to the first magnetic sensor 120a and the strength of the external magnetic field applied the second magnetic sensor 120b so as to reduce the variation in the measured value by the current sensor 100 due to the external magnetic field.

Furthermore, as illustrated in FIG. 2, since the magnetic field 1ae and the magnetic field 1be are offset and the magnetic field 1be and the magnetic field 1ce are offset at the side of a surface opposite to the surface of the third conductor portion 113, which is adjacent to the first conductor portion 111 and the second conductor portion 112, it is possible to reduce the strength of the magnetic field generated outside the current sensor 100.

In the current sensor 100 according to the present preferred embodiment, since a portion of the conductor is not positioned between the first magnetic sensor 120a and the second magnetic sensor 120b, it is possible to reduce or prevent an increase of the width in the width direction (the Y-axis direction) of the current sensor 100.

Since the conductor 110 is capable of being provided only by folding one flat plate made of a metal material or an alloy material, illustrated in FIG. 3, through the press work in the current sensor 100 according to the present preferred embodiment, it is possible to easily provide the conductor 110.

Second Preferred Embodiment

A current sensor according to a second preferred embodiment of the present invention will now be described. Since a current sensor 200 according to the second preferred embodiment differs from the current sensor 100 according to the first preferred embodiment mainly in the orientation of the substrate and the orientation of the detection axis of each of the first magnetic sensor and the second magnetic sensor with respect to the main surface of the substrate, the same reference numerals are used in the current sensor 200 according to the second preferred embodiment to identify the same or similar components in the current sensor 100 according to the first preferred embodiment and a duplicated description of such components is omitted herein.

Figure 7:
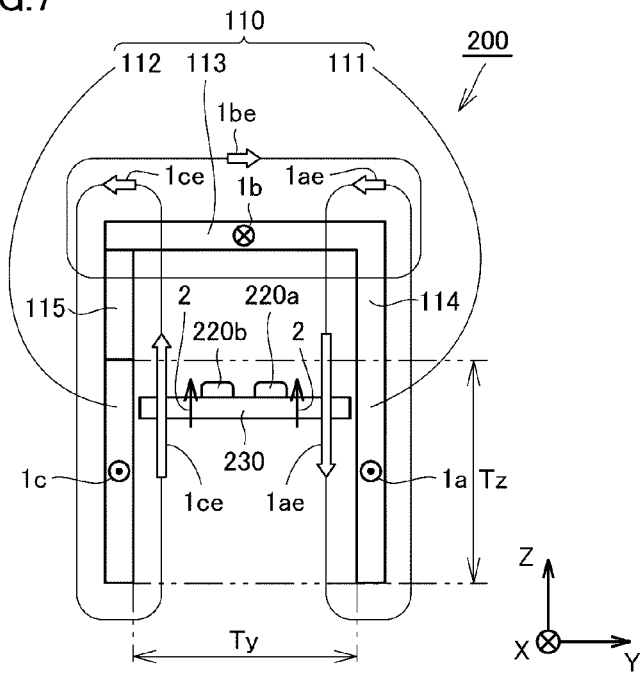
FIG. 7 is a front view illustrating the configuration of a current sensor according to a second preferred embodiment of the present invention.

FIG. 7 is a front view illustrating the configuration of the current sensor according to the second preferred embodiment of the present invention. A state in which the current sensor 200 is viewed from the same direction as in FIG. 2 is illustrated in FIG. 7.

As illustrated in FIG. 7, in the current sensor 200 according to the second preferred embodiment of the present invention, a first magnetic sensor 220a and a second magnetic sensor 220b are mounted on one main surface of a substrate 230. A surface of the third conductor portion 113, which is adjacent to the first conductor portion 111 and the second conductor portion 112, is parallel or substantially parallel to the one main surface of the substrate 230.

Each of the first magnetic sensor 220a and the second magnetic sensor 220b is positioned in the area Ty between the first conductor portion 111 and the second conductor portion 112 in the width direction (the Y-axis direction) and the area Tz extending from one end to the other end in the height direction (the Z-axis direction) of both of the first conductor portion 111 and the second conductor portion 112. The area Ty extends from the position of the third end portion 112a of the second conductor portion 112 to the position of the second end portion 111b of the first conductor portion 111 in the length direction (the X-axis direction).

The shortest distance between the first magnetic sensor 220a and the first conductor portion 111 is shorter than the shortest distance between the first magnetic sensor 220a and the second conductor portion 112. The shortest distance between the second magnetic sensor 220b and the second conductor portion 112 is shorter than the shortest distance between the second magnetic sensor 220b and the first conductor portion 111.

The shortest distance between the first magnetic sensor 220a and the first conductor portion 111 is shorter than the shortest distance between the first magnetic sensor 220a and the third conductor portion 113. The shortest distance between the second magnetic sensor 220b and the second conductor portion 112 is shorter than the shortest distance between the second magnetic sensor 220b and the third conductor portion 113.

Each of the first magnetic sensor 220a and the second magnetic sensor 220b includes the detection axis 2 and is disposed such that the detection axis 2 is directed to the height direction (the Z-axis direction).

Since the substrate 230 is not positioned between the first magnetic sensor 220a and the second magnetic sensor 220b in the current sensor 200 according to the second preferred embodiment of the present invention, the first magnetic sensor 220a and the second magnetic sensor 220b are capable of being disposed closer to each other. Accordingly, it is possible to decrease the difference between the strength of the external magnetic field applied to the first magnetic sensor 220a and the strength of the external magnetic field applied the second magnetic sensor 220b so as to reduce the variation in the measured value by the current sensor 200 due to the external magnetic field.

Third Preferred Embodiment

A current sensor according to a third preferred embodiment of the present invention will now be described. Since a current sensor 300 according to the third preferred embodiment differs from the current sensor 100 according to the first preferred embodiment only in that the substrate is housed in a housing, the same reference numerals are used in the current sensor 300 according to the third preferred embodiment to identify the same or similar components in the current sensor 100 according to the first preferred embodiment and a duplicated description of such components is omitted herein.

Figure 8:
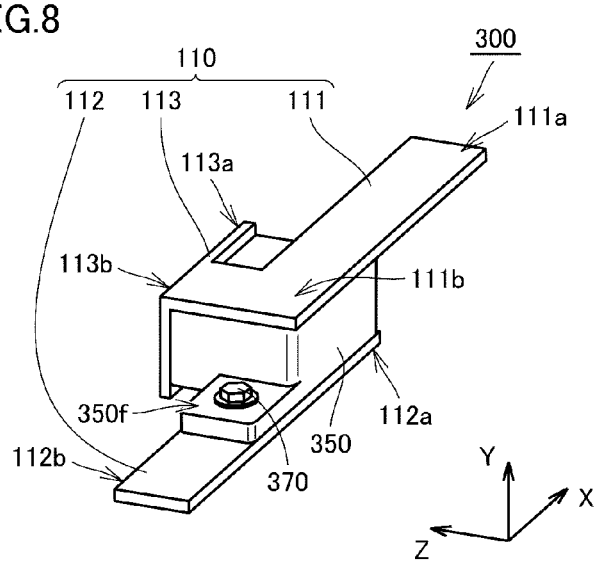
FIG. 8 is a perspective view illustrating the external appearance of a current sensor according to a third preferred embodiment of the present invention.

FIG. 8 is a perspective view illustrating the external appearance of the current sensor according to the third preferred embodiment of the present invention. As illustrated in FIG. 8, the current sensor 300 according to the third preferred embodiment of the present invention further includes a housing 350 in which the substrate 130 including the first magnetic sensor 120a and the second magnetic sensor 120b mounted thereon is housed. A flange portion 350f is provided for the housing 350. A through hole (not illustrated) is provided in the flange portion 350f. A through hole (not illustrated) is provided in the second conductor portion 112 at a position corresponding to the through hole of the housing 350. The flange portion 350f is disposed outside the area from the position of the third end portion 112a of the second conductor portion 112 to the position of the second end portion 111b of the first conductor portion 111 in the length direction (the X-axis direction).

Screwing a bolt 370 passing through the through hole in the flange portion 350f and the through hole in the second conductor portion 112 with a nut (not illustrated) enables the housing 350 to be fastened to the conductor 110. Each of the bolt 370 and the nut is preferably made of a non-magnetic material. The method of joining the housing 350 to the conductor 110 is not limited to the above-described method and the housing 350 may be bonded to the conductor 110 through heat welding using resin or through adhesion using an adhesive. Alternatively, a latching portion that latches the housing 350 onto the conductor 110 may be provided on the housing 350 and the latching portion may be latched onto the conductor 110 to fix the housing 350 to the conductor 110.

In the present preferred embodiment, the housing 350 is in contact with the first conductor portion 111, the second conductor portion 112, and the third conductor portion 113. Accordingly, the variation in the position of the first magnetic sensor 120a with respect to the first conductor portion 111 and the variation in the position of the second magnetic sensor 120b with respect to the second conductor portion 112 are capable of being reduced to reduce the variation in the measurement accuracy while improving the sensitivity of the current sensor 300. As a result, it is possible to increase the measurement reproducibility and the mass-production efficiency of the current sensor 300. In addition, the housing 350 is capable of being protected from the outside with the first conductor portion 111, the second conductor portion 112, and the third conductor portion 113.

The housing 350 is made of engineering plastics, such as poly phenylene sulfide (PPS), polybutyrene terephthalate (PBT) resin, liquid crystal polymer (LCP), urethane, or nylon, for example. Since PPS has high heat resistance, PPS is preferable as the material of the housing 350, considering the heat generation in the conductor 110.

Figure 9:
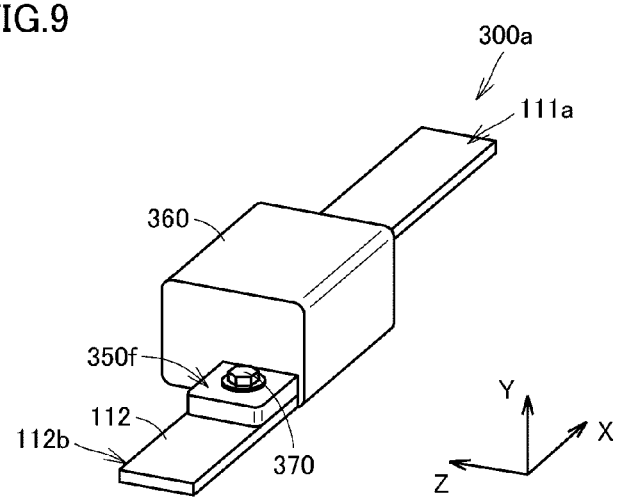
FIG. 9 is a perspective view illustrating the external appearance of a current sensor according to a modification of the third preferred embodiment of the present invention.

A portion of each of the housing 350 and the conductor 110 may be sealed with insulating resin. FIG. 9 is a perspective view illustrating the external appearance of a current sensor according to a modification of the third preferred embodiment of the present invention. As illustrated in FIG. 9, in a current sensor 300a according to the modification of the third preferred embodiment of the present invention, a portion of each of the housing 350 and the conductor 110 is sealed with insulating resin 360. Performing insert molding using the insulating resin 360 enables a portion of the first conductor portion 111, a portion of the second conductor portion 112, the third conductor portion 113, and the housing 350 to be sealed.

The material of the insulating resin 360 is thermoplastic resin or thermosetting resin, for example. From the viewpoint of the heat resistance and the molding accuracy, for example, acrylonitrile butadiene styrene (ABS) resin, poly phenylene sulfide (PPS) resin, liquid crystal polymer (LCP), polybutyrene terephthalate (PBT) resin, epoxy resin, or polyamide (PA) resin is preferable as the material of the insulating resin 360.

A portion of the conductor 110 and the substrate 130 on which the first magnetic sensor 120a and the second magnetic sensor 120b are mounted may be sealed with the insulating resin 360 without the housing 350.

Fourth Preferred Embodiment

A current sensor according to a fourth preferred embodiment of the present invention will now be described. Since a current sensor 400 according to the fourth preferred embodiment differs from the current sensor 100 according to the first preferred embodiment mainly in the length of a fifth conductor portion, the same reference numerals are used in the current sensor 400 according to the fourth preferred embodiment to identify the same or similar components in the current sensor 100 according to the first preferred embodiment and a duplicated description of such components is omitted herein.

Figure 10:
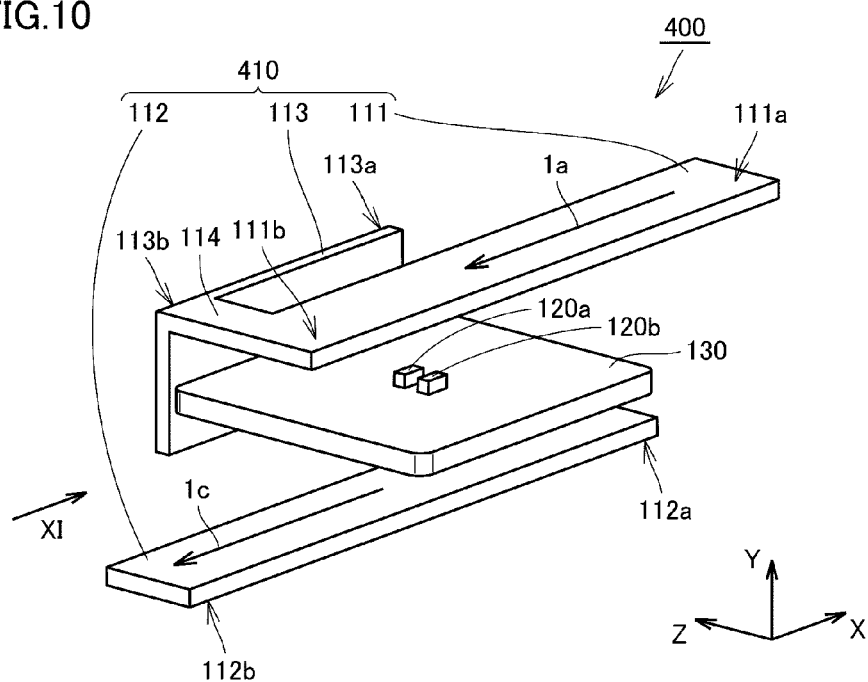
FIG. 10 is a perspective view illustrating the external appearance of a current sensor according to a fourth preferred embodiment of the present invention.
Figure 11:
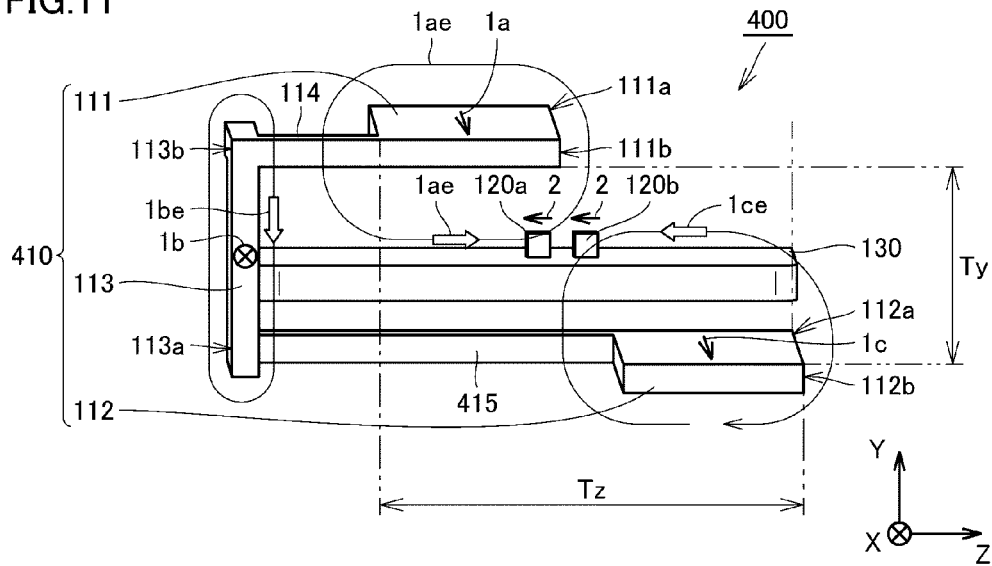
FIG. 11 is a perspective view of the current sensor in FIG. 10, viewed from the direction of an arrow XI.
Figure 12:
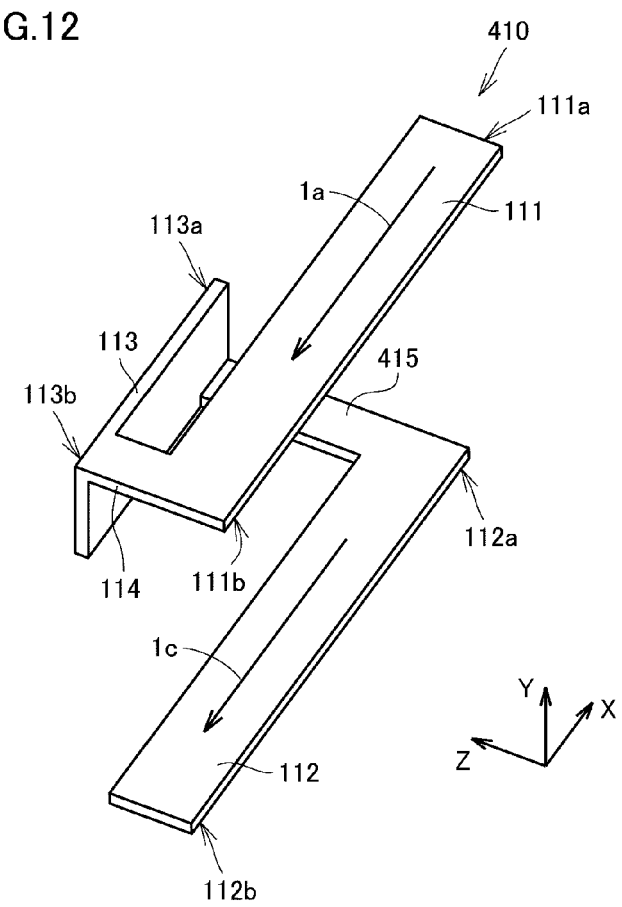
FIG. 12 is a perspective view illustrating the external appearance of a conductor in the current sensor according to the fourth preferred embodiment of the present invention.

FIG. 10 is a perspective view illustrating the external appearance of the current sensor according to the fourth preferred embodiment of the present invention. FIG. 11 is a perspective view of the current sensor in FIG. 10, viewed from the direction of an arrow XI. FIG. 12 is a perspective view illustrating the external appearance of a conductor in the current sensor according to the fourth preferred embodiment of the present invention.

As illustrated in FIG. 10 and FIG. 11, the current sensor 400 according to the fourth preferred embodiment of the present invention includes a conductor 410, the first magnetic sensor 120a, and the second magnetic sensor 120b. Current to be measured flows through the conductor 410. The conductor 410 has the length direction (the X-axis direction), the width direction (the Y-axis direction) orthogonal or substantially orthogonal to the length direction (the X-axis direction), and the height direction (the Z-axis direction) orthogonal or substantially orthogonal to the length direction (the X-axis direction) and the width direction (the Y-axis direction). The first magnetic sensor 120a and the second magnetic sensor 120b detect the strength of a magnetic field generated by the current.

A fifth conductor portion 415 of the conductor 410 is longer than the fifth conductor portion 115 of the conductor 110 according to the first preferred embodiment. As a result, when viewed from the width direction (the Y-axis direction), the position of the first conductor portion 111 is shifted from the position of the second conductor portion 112 in the height direction (the Z-axis direction).

The first magnetic sensor 120a and the second magnetic sensor 120b are mounted on one main surface of the substrate 130. The one main surface of the substrate 130 is parallel or substantially parallel to the surface of the first conductor portion 111 at the second conductor portion 112 side. The other main surface of the substrate 130 is parallel or substantially parallel to the surface of the second conductor portion 112 at the first conductor portion 111 side.

Each of the first magnetic sensor 120a and the second magnetic sensor 120b is positioned in the area Ty between the first conductor portion 111 and the second conductor portion 112 in the width direction (the Y-axis direction) and the area Tz extending from one end to the other end in the height direction (the Z-axis direction) of both of the first conductor portion 111 and the second conductor portion 112.

The shortest distance between the first magnetic sensor 120a and the first conductor portion 111 is shorter than the shortest distance between the first magnetic sensor 120a and the second conductor portion 112. The shortest distance between the second magnetic sensor 120b and the second conductor portion 112 is shorter than the shortest distance between the second magnetic sensor 120b and the first conductor portion 111.

The shortest distance between the first magnetic sensor 120a and the first conductor portion 111 is shorter than the shortest distance between the first magnetic sensor 120a and the third conductor portion 113. The shortest distance between the second magnetic sensor 120b and the second conductor portion 112 is shorter than the shortest distance between the second magnetic sensor 120b and the third conductor portion 113.

As illustrated in FIG. 11, according to the right-handed screw rule, the magnetic field 1ae that goes around the first conductor portion 111 occurs, the magnetic field 1ce that goes around the second conductor portion 112 occurs, and the magnetic field 1be that goes around the third conductor portion 113 occurs.

As described above, the first magnetic sensor 120a is positioned toward the first conductor portion 111 in the area Ty and the area Tz. Accordingly, the magnetic field 1ae around the first conductor portion 111 is mainly applied to the first magnetic sensor 120a. The second magnetic sensor 120b is positioned toward the second conductor portion 112 in the area Ty and the area Tz. Accordingly, the magnetic field 1ce around the second conductor portion 112 is mainly applied to the second magnetic sensor 120b.

As described above, since the position of the first conductor portion 111 and the position of the second conductor portion 112 are shifted from each other in the height direction (the Z-axis direction), viewed from the width direction (the Y-axis direction), the magnetic field 1ae hardly enters the surface of the second conductor portion 112 at the first conductor portion 111 side and the magnetic field 1ce hardly enters the surface of the first conductor portion 111 at the second conductor portion 112 side. As a result, eddy current loss that occurs when the magnetic field 1ae enters the surface of the second conductor portion 112 at the first conductor portion 111 side and eddy current loss that occurs when the magnetic field 1ce enters the surface of the first conductor portion 111 at the second conductor portion 112 side are capable of being reduced. Accordingly, it is possible to reduce or prevent a reduction in the output from the current sensor 400 and to improve frequency characteristics of the current sensor 400.

Fifth Preferred Embodiment

A current sensor according to a fifth preferred embodiment of the present invention will now be described. Since the current sensor according to the fifth preferred embodiment differs from the current sensor 100 according to the first preferred embodiment mainly in the lengths of a fourth conductor portion and a fifth conductor portion, the same reference numerals are used in the current sensor according to the fifth preferred embodiment to identify the same or similar components in the current sensor 100 according to the first preferred embodiment and a duplicated description of such components is omitted herein.

Figure 13:
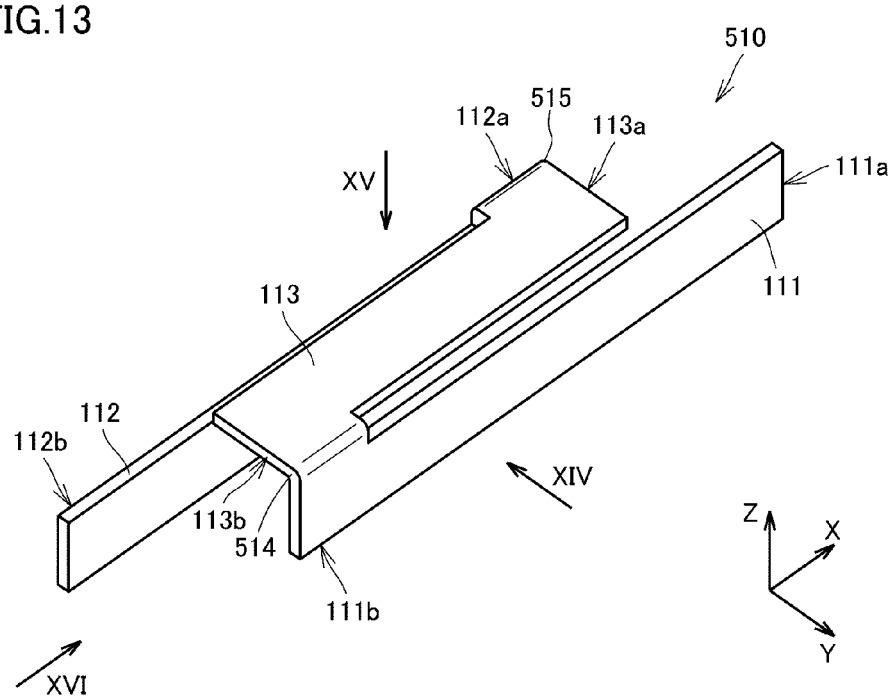
FIG. 13 is a perspective view illustrating the external appearance of a conductor in a current sensor according to a fifth preferred embodiment of the present invention.
Figure 14:
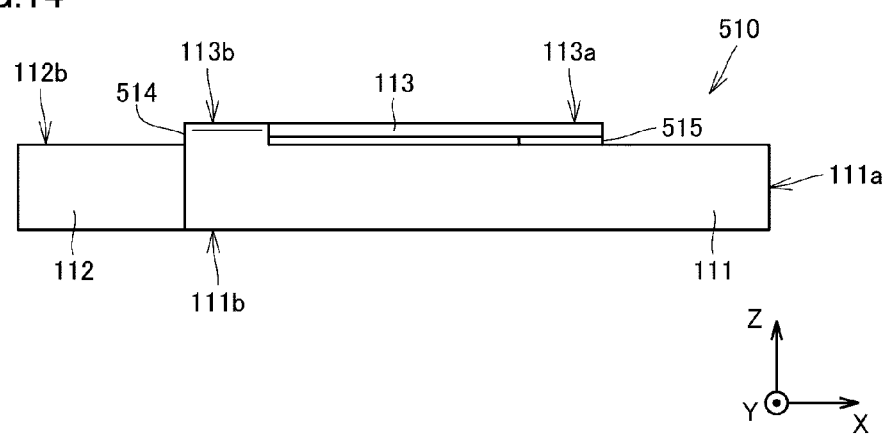
FIG. 14 is a side view of the conductor in FIG. 13, viewed from the direction of an arrow XIV.
Figure 15:
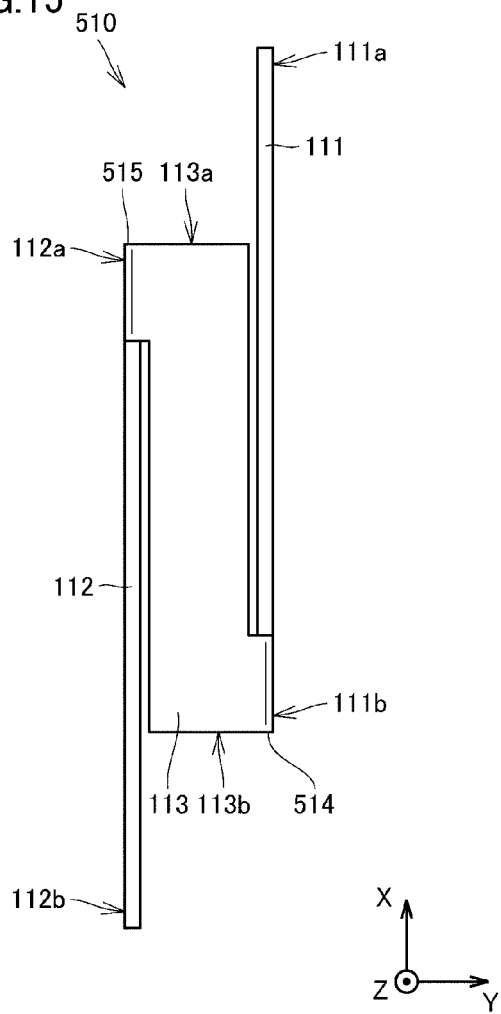
FIG. 15 is a plan view of the conductor in FIG. 13, viewed from the direction of an arrow XV.
Figure 16:
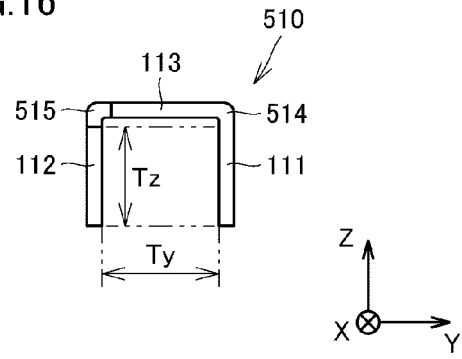
FIG. 16 is a front view of the conductor in FIG. 13, viewed from the direction of an arrow XVI.

FIG. 13 is a perspective view illustrating the external appearance of a conductor in the current sensor according to the fifth preferred embodiment of the present invention. FIG. 14 is a side view of the conductor in FIG. 13, viewed from the direction of an arrow XIV. FIG. 15 is a plan view of the conductor in FIG. 13, viewed from the direction of an arrow XV. FIG. 16 is a front view of the conductor in FIG. 13, viewed from the direction of an arrow XVI.

As illustrated in FIG. 13 to FIG. 16, each of a fourth conductor portion 514 and a fifth conductor portion 515 of a conductor 510 in the current sensor according to the fifth preferred embodiment of the present invention includes a portion extending in the width direction (the Y-axis direction) and a portion extending in the height direction (the Z-axis direction). In other words, each of the fourth conductor portion 514 and the fifth conductor portion 515 is bent.

The portion extending in the height direction (the Z-axis direction) of the fourth conductor portion 514 of the conductor 510 is shorter than the fourth conductor portion 114 of the conductor 110 according to the first preferred embodiment. The portion extending in the height direction (the Z-axis direction) of the fifth conductor portion 515 of the conductor 510 is shorter than the fifth conductor portion 115 of the conductor 110 according to the first preferred embodiment. Accordingly, it is possible to reduce the size of the current sensor.

Sixth Preferred Embodiment

A current sensor according to a sixth preferred embodiment of the present invention will now be described. Since the current sensor according to the sixth preferred embodiment differs from the current sensor 100 according to the first preferred embodiment mainly in the shape of a third conductor portion, the same reference numerals are used in the current sensor according to the sixth preferred embodiment to identify the same or similar components in the current sensor 100 according to the first preferred embodiment and a duplicated description of such components is omitted herein.

Figure 17:
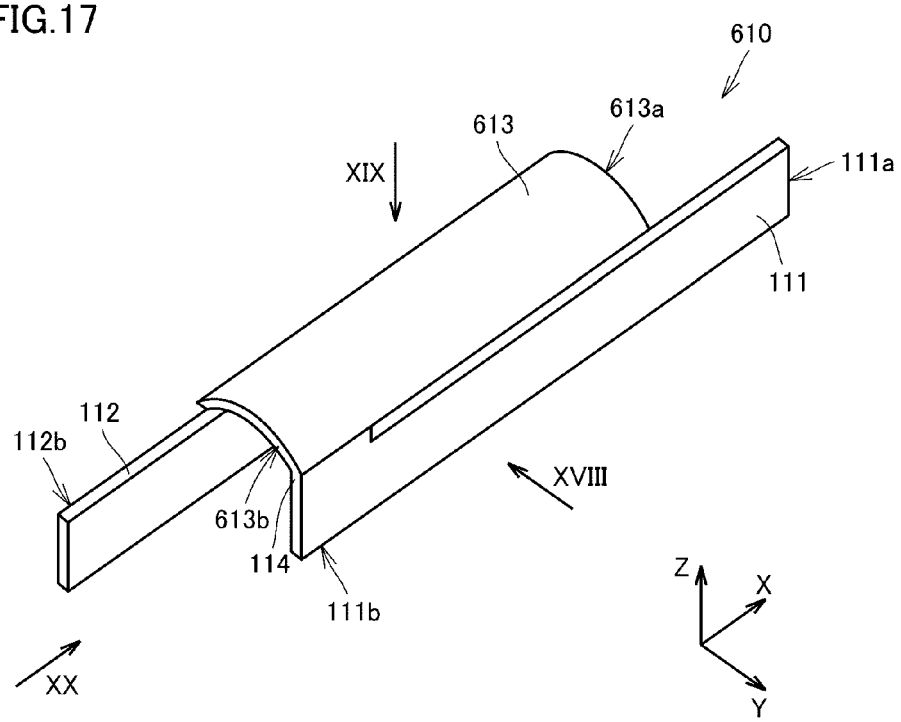
FIG. 17 is a perspective view illustrating the external appearance of a conductor in a current sensor according to a sixth preferred embodiment of the present invention.
Figure 18:
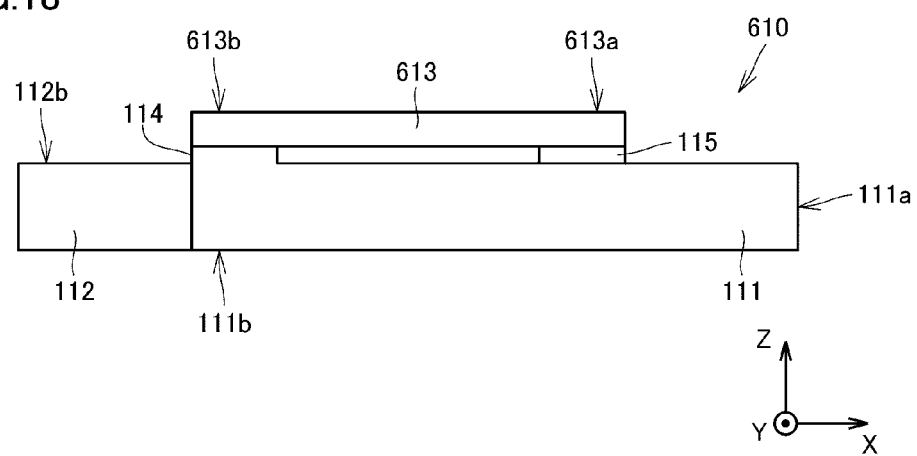
FIG. 18 is a side view of the conductor in FIG. 17, viewed from the direction of an arrow XVIII.
Figure 19:
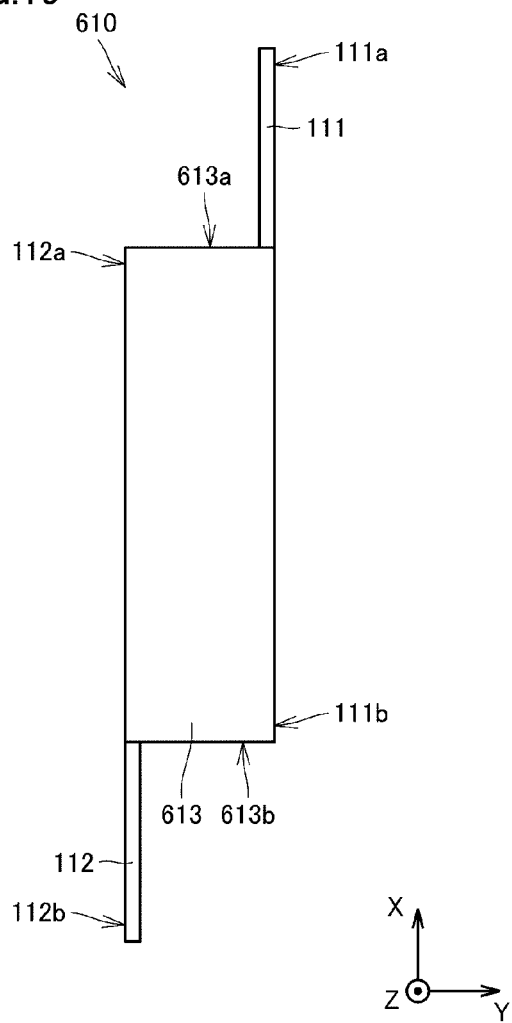
FIG. 19 is a plan view of the conductor in FIG. 17, viewed from the direction of an arrow XIX.
Figure 20:
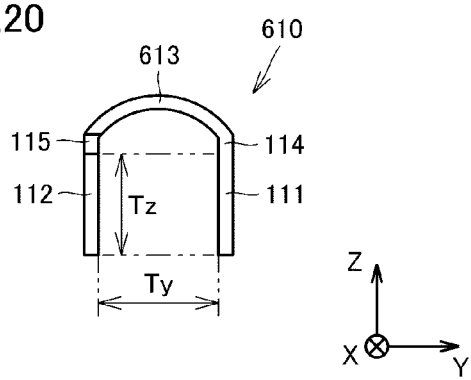
FIG. 20 is a front view of the conductor in FIG. 17, viewed from the direction of an arrow XX.

FIG. 17 is a perspective view illustrating the external appearance of a conductor in the current sensor according to the sixth preferred embodiment of the present invention. FIG. 18 is a side view of the conductor in FIG. 17, viewed from the direction of an arrow XVIII. FIG. 19 is a plan view of the conductor in FIG. 17, viewed from the direction of an arrow XIX. FIG. 20 is a front view of the conductor in FIG. 17, viewed from the direction of an arrow XX.

As illustrated in FIG. 17 to FIG. 20, a third conductor portion 613 of a conductor 610 in the current sensor according to the sixth preferred embodiment of the present invention is convexly bent toward a side opposite to the first conductor portion 111 side in the height direction (the Z-axis direction), viewed from the length direction (the X-axis direction). In the present preferred embodiment, the convexly bent shape is preferably a curved shape, for example. The third conductor portion 613 is positioned between the first conductor portion 111 and the second conductor portion 112 in the height direction (the Z-axis direction) and includes a fifth end portion 613a and a sixth end portion 613b in the length direction (the X-axis direction).

Since the shortest distance between each of the first magnetic sensor 120a and the second magnetic sensor 120b and the third conductor portion 613 is increased because of the curved shape of the third conductor portion 613, it is possible to make application of the magnetic field around the third conductor portion 613 to each of the first magnetic sensor 120a and the second magnetic sensor 120b difficult.

Seventh Preferred Embodiment

A current sensor according to a seventh preferred embodiment of the present invention will now be described. Since the current sensor according to the seventh preferred embodiment differs from the current sensor 100 according to the first preferred embodiment mainly in the shape of a conductor, the same reference numerals are used in the current sensor according to the seventh preferred embodiment to identify the same or similar components in the current sensor 100 according to the first preferred embodiment and a duplicated description of such components is omitted herein.

Figure 21:
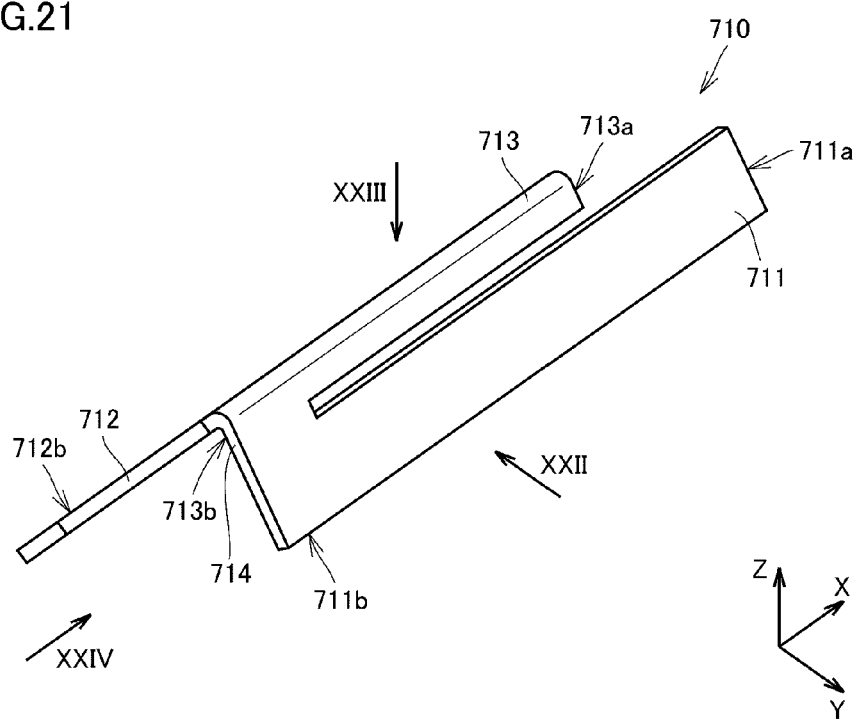
FIG. 21 is a perspective view illustrating the external appearance of a conductor in a current sensor according to a seventh preferred embodiment of the present invention.
Figure 22:
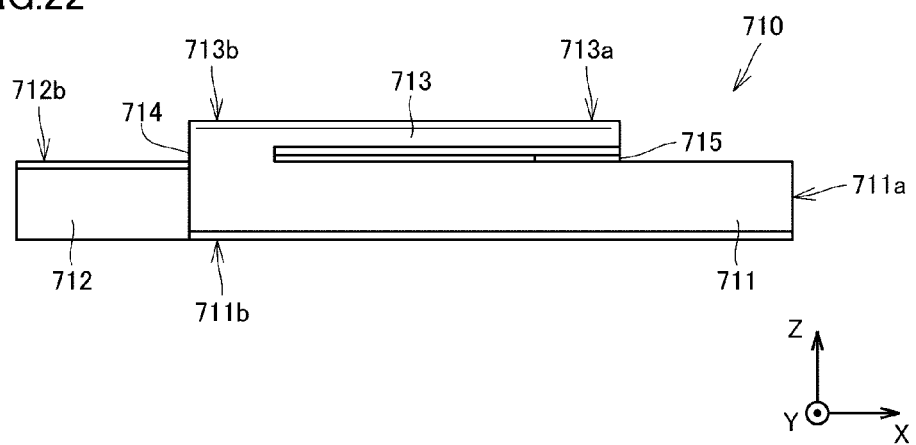
FIG. 22 is a side view of the conductor in FIG. 21, viewed from the direction of an arrow XXII.
Figure 23:
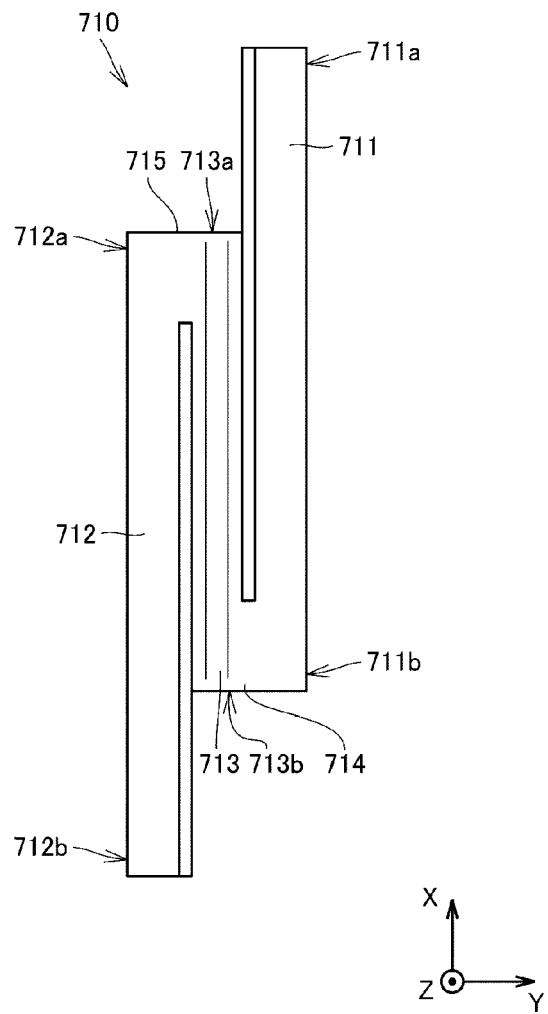
FIG. 23 is a plan view of the conductor in FIG. 21, viewed from the direction of an arrow XXIII.
Figure 24:
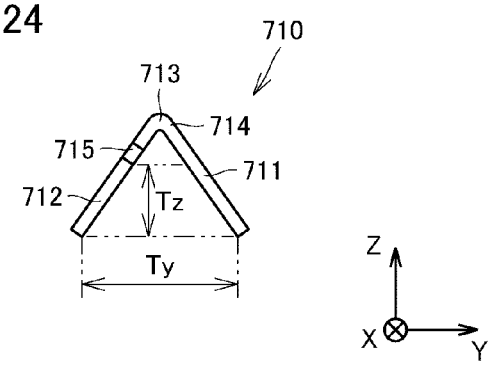
FIG. 24 is a front view of the conductor in FIG. 21, viewed from the direction of an arrow XXIV.

FIG. 21 is a perspective view illustrating the external appearance of a conductor in the current sensor according to the seventh preferred embodiment of the present invention. FIG. 22 is a side view of the conductor in FIG. 21, viewed from the direction of an arrow XXII. FIG. 23 is a plan view of the conductor in FIG. 21, viewed from the direction of an arrow XXIII. FIG. 24 is a front view of the conductor in FIG. 21, viewed from the direction of an arrow XXIV.

As illustrated in FIG. 21 to FIG. 24, a conductor 710 in the current sensor according to the seventh preferred embodiment of the present invention includes a first conductor portion 711, a second conductor portion 712, and a third conductor portion 713. The first conductor portion 711 extends in the length direction (the X-axis direction) and includes a first end portion 711a and a second end portion 711b in the length direction (the X-axis direction). The second conductor portion 712 extends in the length direction (the X-axis direction) while being spaced from the first conductor portion 711 in the width direction (the Y-axis direction) and includes a third end portion 712a and a fourth end portion 712b in the length direction (the X-axis direction). The third conductor portion 713 is positioned between the first conductor portion 711 and the second conductor portion 712, viewed from the height direction (the Z-axis direction), and includes a fifth end portion 713a and a sixth end portion 713b in the length direction (the X-axis direction).

Connection of the sixth end portion 713b to one end of the second end portion 711b in the height direction (the Z-axis direction) causes the first conductor portion 711 and the third conductor portion 713 to be connected to each other. Specifically, the second end portion 711b and the sixth end portion 713b are connected to each other with a fourth conductor portion 714 disposed therebetween. The fourth conductor portion 714 is a portion of the conductor 710.

Connection of the fifth end portion 713a to one end of the third end portion 712a in the height direction (the Z-axis direction) causes the second conductor portion 712 and the third conductor portion 713 to be connected to each other. Specifically, the third end portion 712a and the fifth end portion 713a are connected to each other with a fifth conductor portion 715 disposed therebetween. The fifth conductor portion 715 is a portion of the conductor 710.

In the present preferred embodiment, each of the first conductor portion 711 and the second conductor portion 712 preferably has a plate shape, for example. When viewed from the length direction (the X-axis direction), the first virtual plane including the surface of the first conductor portion 711 at the second conductor portion 712 side and the second virtual plane including the surface of the second conductor portion 712 at the first conductor portion 711 side intersect with each other. The angle between the first virtual plane and the second virtual plane is preferably, for example, about 60 degrees.

The third conductor portion 713 extends in the length direction (the X-axis direction). The third conductor portion 713 is convexly bent toward a side opposite to the first conductor portion 711 side in the height direction (the Z-axis direction), viewed from the length direction (the X-axis direction). In the present preferred embodiment, the convexly bent shape is preferably a flex shape, for example. The fourth conductor portion 714 extends along the first virtual plane. The fifth conductor portion 715 extends along the second virtual plane.

Each of the first magnetic sensor 120a and the second magnetic sensor 120b is positioned in the area Ty between the first conductor portion 711 and the second conductor portion 712 in the width direction (the Y-axis direction) and the area Tz extending from one end to the other end in the height direction (the Z-axis direction) of both the first conductor portion 711 and the second conductor portion 712.

The shortest distance between the first magnetic sensor 120a and the first conductor portion 711 is shorter than the shortest distance between the first magnetic sensor 120a and the second conductor portion 712. The shortest distance between the second magnetic sensor 120b and the second conductor portion 712 is shorter than the shortest distance between the second magnetic sensor 120b and the first conductor portion 711.

The shortest distance between the first magnetic sensor 120a and the first conductor portion 711 is shorter than the shortest distance between the first magnetic sensor 120a and the third conductor portion 713. The shortest distance between the second magnetic sensor 120b and the second conductor portion 712 is shorter than the shortest distance between the second magnetic sensor 120b and the third conductor portion 713.

Since the conductor 710 has the above-described shape, it is possible to reduce the size of the current sensor.

Eighth Preferred Embodiment

A current sensor according to an eighth preferred embodiment of the present invention will now be described. Since the current sensor according to the eighth preferred embodiment differs from the current sensor according to the fifth preferred embodiment mainly in the shape of a third conductor portion, the same reference numerals are used in the current sensor according to the eighth preferred embodiment to identify the same or similar components in the current sensor according to the fifth preferred embodiment and a duplicated description of such components is omitted herein.

Figure 25:
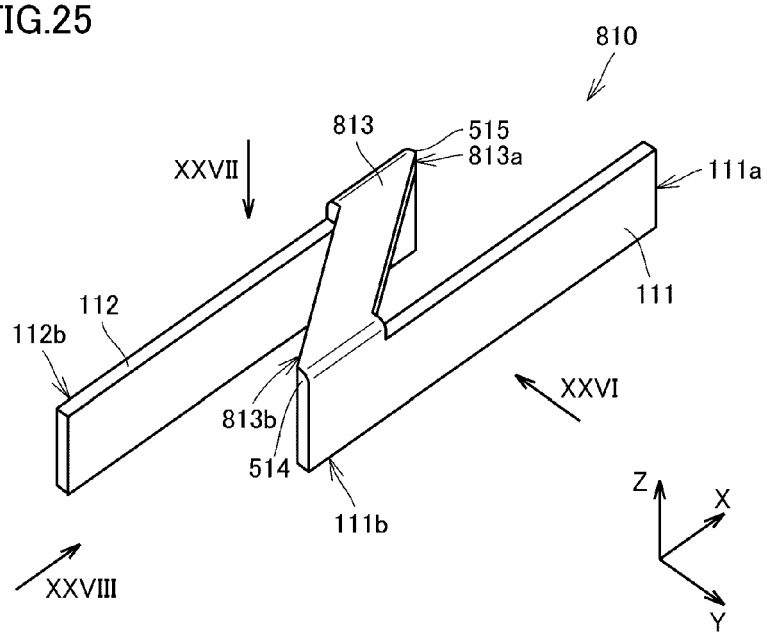
FIG. 25 is a perspective view illustrating the external appearance of a conductor in a current sensor according to an eighth preferred embodiment of the present invention.
Figure 26:
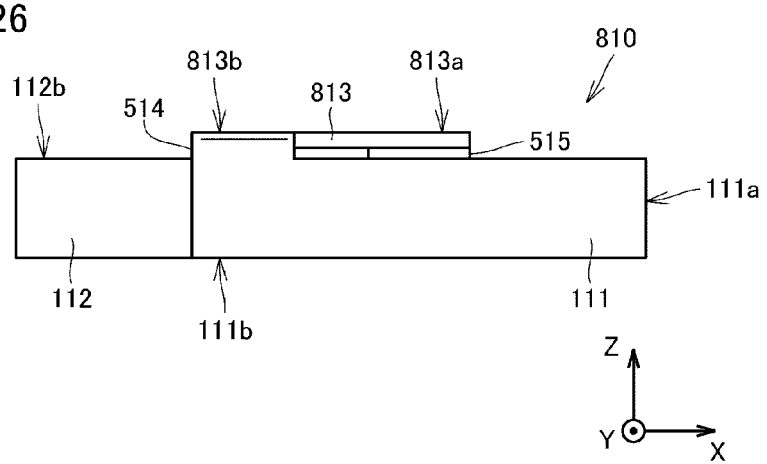
FIG. 26 is a side view of the conductor in FIG. 25, viewed from the direction of an arrow XXVI.
Figure 27:
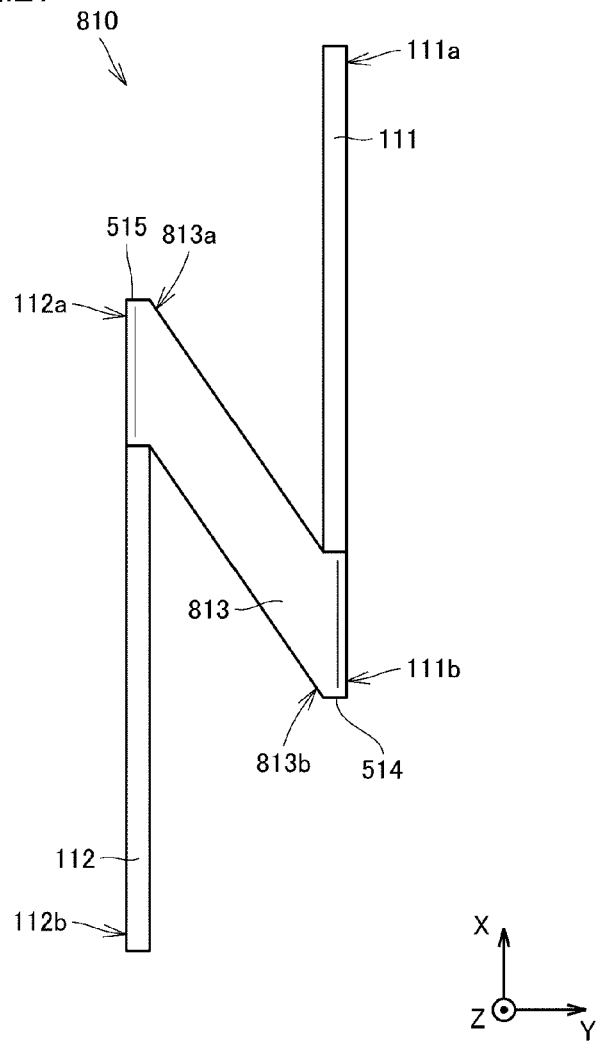
FIG. 27 is a plan view of the conductor in FIG. 25, viewed from the direction of an arrow XXVII.
Figure 28:
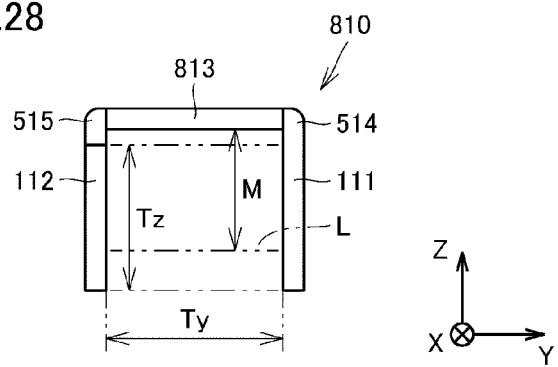
FIG. 28 is a front view of the conductor in FIG. 25, viewed from the direction of an arrow XXVIII.

FIG. 25 is a perspective view illustrating the external appearance of a conductor in the current sensor according to the eighth preferred embodiment of the present invention. FIG. 26 is a side view of the conductor in FIG. 25, viewed from the direction of an arrow XXVI. FIG. 27 is a plan view of the conductor in FIG. 25, viewed from the direction of an arrow XXVII. FIG. 28 is a front view of the conductor in FIG. 25, viewed from the direction of an arrow XXVIII.

As illustrated in FIG. 25 to FIG. 28, a third conductor portion 813 of a conductor 810 in the current sensor according to the eighth preferred embodiment of the present invention extends in the length direction (the X-axis direction) and the width direction (the Y-axis direction). In other words, the third conductor portion 813 extends so as to intersect with the first conductor portion 111 and the second conductor portion 112 at an angle other than the right angle, viewed from the height direction (the Z-axis direction). The angle at which each of the first conductor portion 111 and the second conductor portion 112 intersects with the third conductor portion 813, viewed from the height direction (the Z-axis direction), is preferably, for example, about 30 degrees.

Figure 29:
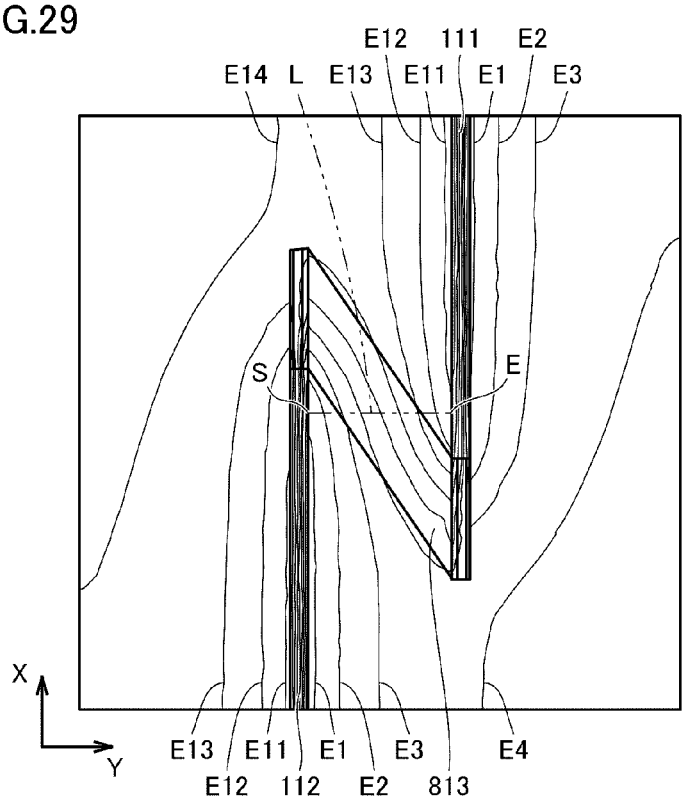
FIG. 29 is a contour map illustrating a result of simulation analysis of the distribution of the magnetic flux density of a magnetic field occurring around the conductor in the current sensor according to the eighth preferred embodiment of the present invention.
Figure 30:
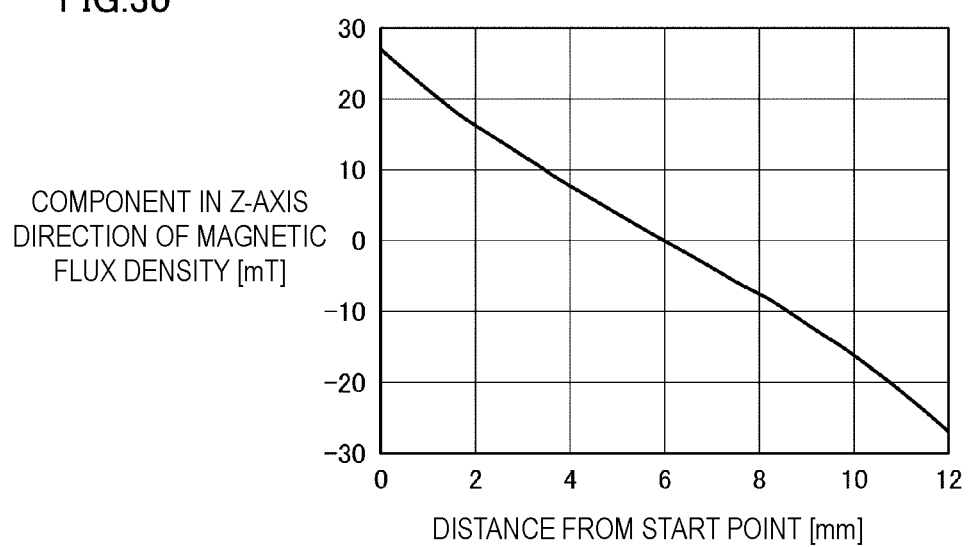
FIG. 30 is a graph illustrating the relationship between the component (mT) in the Z-axis direction of the magnetic flux density and the distance (mm) from a start point S on a virtual straight line L that extends in the Y-axis direction from the start point S to an end point E in FIG. 29.

FIG. 29 is a contour map illustrating a result of simulation analysis of the distribution of the magnetic flux density of the magnetic field occurring around the conductor in the current sensor according to the eighth preferred embodiment of the present invention. FIG. 30 is a graph illustrating the relationship between the component (mT) in the Z-axis direction of the magnetic flux density and the distance (mm) from a start point S on a virtual straight line L that extends in the Y-axis direction from the start point S to an end point E in FIG. 29.

In the simulation analysis, in the cross-sectional dimensions of each of the first conductor portion 111, the second conductor portion 112, and the third conductor portion 813, the width was set to about 10 mm and the thickness was set to about 1.5 mm. As illustrated in FIG. 28, the position of the virtual straight line L in the height direction (the Z-axis direction) was set to a position a distance M apart from a surface of the third conductor portion 813, which is adjacent to the first conductor portion 111 and the second conductor portion 112. The distance M was set to about 7.25 mm. The value of the current flowing through the first conductor portion 111, the second conductor portion 112, and the third conductor portion 113 was set to about 600 A.

Referring to FIG. 29, a line in which the component in the height direction (the Z-axis direction) of the magnetic flux density is set to about 40 mT is denoted by E1, a line in which the component in the height direction (the Z-axis direction) of the magnetic flux density is set to about 32 mT is denoted by E2, a line in which the component in the height direction (the Z-axis direction) of the magnetic flux density is set to about 24 mT is denoted by E3, and a line in which the component in the height direction (the Z-axis direction) of the magnetic flux density is set to about 16 mT is denoted by E4. A line in which the component in the height direction (the Z-axis direction) of the magnetic flux density is set to about −40 mT is denoted by E11, a line in which the component in the height direction (the Z-axis direction) of the magnetic flux density is set to about −32 mT is denoted by E12, a line in which the component in the height direction (the Z-axis direction) of the magnetic flux density is set to about −24 mT is denoted by E13, and a line in which the component in the height direction (the Z-axis direction) of the magnetic flux density is set to about −16 mT is denoted by E14. As for the components in the height direction (the Z-axis direction) of the magnetic flux density, each upward magnetic flux in FIG. 28 was indicated by a positive value and each downward magnetic flux in FIG. 28 was indicated by a negative value.

As illustrated in FIG. 30, the signs of the components in the height direction (the Z-axis direction) of the magnetic flux density were reversed from a position about 6 mm apart from the start point, which is an intermediate point between the start point S and the end point E on the virtual straight line L. Specifically, the components in the height direction (the Z-axis direction) of the magnetic flux density had positive values at positions the distances from the start point to which are shorter than about 6 mm and the components in the height direction (the Z-axis direction) of the magnetic flux density had negative values at positions the distances from the start point to which are longer than about 6 mm.

The first magnetic sensor 120a is disposed at a position the distance from the start point to which is longer than about 6 mm on the virtual straight line L. The second magnetic sensor 120b is disposed at a position the distance from the start point to which is shorter than about 6 mm on the virtual straight line L.

Accordingly, the orientation of the magnetic flux of the magnetic field 1*ae* applied to the first magnetic sensor 120*a* is opposite to the orientation of the magnetic flux of the magnetic field 1*be* applied to the second magnetic sensor 120*b*. Consequently, in terms of the strength of the magnetic field generated by the current to be measured flowing through the conductor 810, the phase of the value detected by the first magnetic sensor 120*a* is opposite to the phase of the value detected by the second magnetic sensor 120*b*. As a result, when the strength of the magnetic field detected by the first magnetic sensor 120*a* is set to a positive value, the strength of the magnetic field detected by the second magnetic sensor 120*b* has a negative value.

The arithmetic operation of the value detected by the first magnetic sensor 120*a* and the value detected by the second magnetic sensor 120*b* is performed by the calculator 190. Specifically, the calculator 190 subtracts the value detected by the second magnetic sensor 120*b* from the value detected by the first magnetic sensor 120*a*. The value of the current to be measured that flowed through the conductor 810 is calculated from the result of the subtraction.

In the current sensor according to the present preferred embodiment, since the third conductor portion 813 is configured such that the fourth conductor portion 514 is connected to the fifth conductor portion 515 with the shortest distance, it is possible to increase the density of the current flowing through the third conductor portion 813 to improve the frequency characteristics of the current sensor.

Ninth Preferred Embodiment

A current sensor according to a ninth preferred embodiment of the present invention will now be described. Since the current sensor according to the ninth preferred embodiment differs from the current sensor 100 according to the first preferred embodiment mainly in the shapes of a fourth conductor portion and a fifth conductor portion, the same reference numerals are used in the current sensor according to the ninth preferred embodiment to identify the same or similar components in the current sensor 100 according to the first preferred embodiment and a duplicated description of such components is omitted herein.

Figure 31:
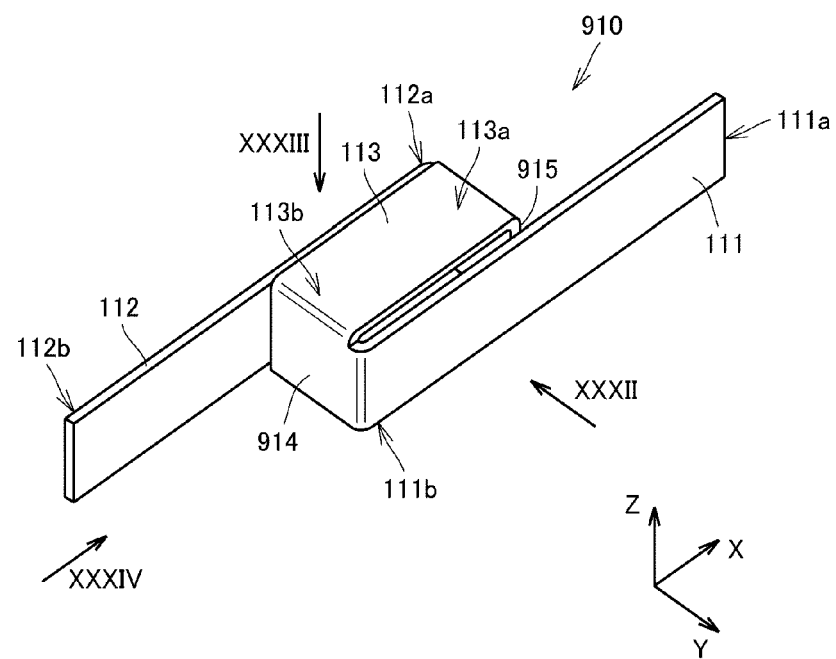
FIG. 31 is a perspective view illustrating the external appearance of a conductor in a current sensor according to a ninth preferred embodiment of the present invention.
Figure 32:
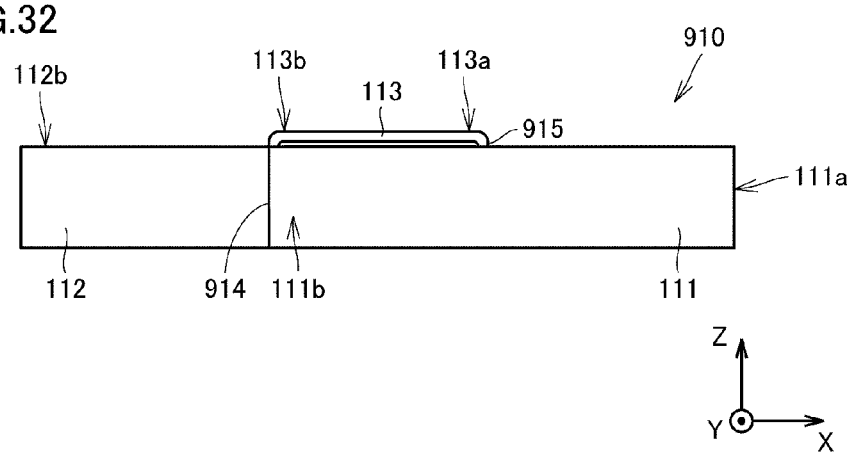
FIG. 32 is a side view of the conductor in FIG. 31, viewed from the direction of an arrow XXXII.
Figure 33:
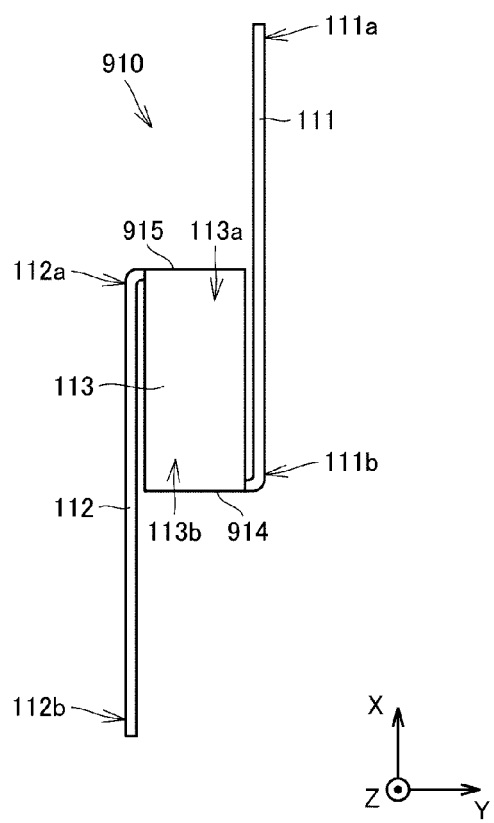
FIG. 33 is a plan view of the conductor in FIG. 31, viewed from the direction of an arrow XXXIII.
Figure 34:
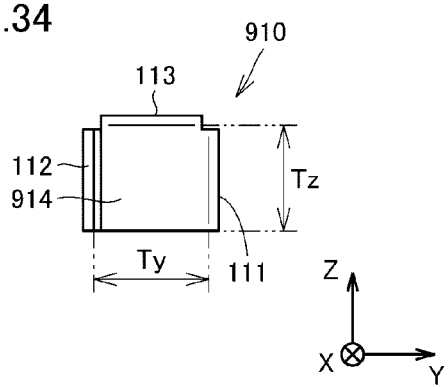
FIG. 34 is a front view of the conductor in FIG. 31, viewed from the direction of an arrow XXXIV.

FIG. 31 is a perspective view illustrating the external appearance of a conductor in the current sensor according to the ninth preferred embodiment of the present invention. FIG. 32 is a side view of the conductor in FIG. 31, viewed from the direction of an arrow XXXII. FIG. 33 is a plan view of the conductor in FIG. 31, viewed from the direction of an arrow XXXIII. FIG. 34 is a front view of the conductor in FIG. 31, viewed from the direction of an arrow XXXIV.

As illustrated in FIG. 31 to FIG. 34, each of a fourth conductor portion 914 and a fifth conductor portion 915 of a conductor 910 in the current sensor according to the ninth preferred embodiment of the present invention extends in the width direction (the Y-axis direction).

The second end portion 111*b* is connected to the sixth end portion 113*b* with the fourth conductor portion 914 interposed therebetween. The third end portion 112*a* is connected to the fifth end portion 113*a* with the fifth conductor portion 915 interposed therebetween.

Tenth Preferred Embodiment

Figure 35:
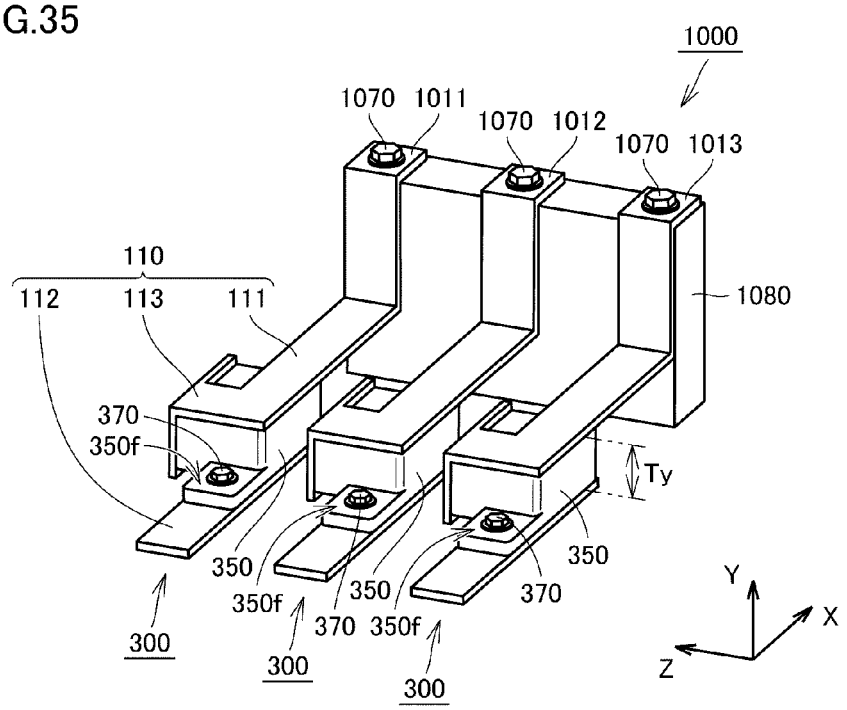
FIG. 35 is a perspective view illustrating the external appearance of a current sensor module according to a tenth preferred embodiment of the present invention.

A current sensor module according to a tenth preferred embodiment of the present invention will now be described. FIG. 35 is a perspective view illustrating the external appearance of the current sensor module according to the tenth preferred embodiment of the present invention.

As illustrated in FIG. 35, a current sensor module 1000 according to the tenth preferred embodiment of the present invention is preferably applied to, for example, three-phase three-wire wiring, such as an inverter. The current sensor module 1000 preferably includes three current sensors 300, for example. Although the number of the current sensors 300 in the current sensor module 1000 is preferably three in the present preferred embodiment, the number of the current sensors 300 is not limited to three as long as the current sensor module 1000 includes multiple current sensors 300.

The conductors 110 in the respective three current sensors 300 are disposed so as to be parallel or substantially parallel to each other. The current sensor module 1000 further includes a base 1080 to which the three conductors 110 are mounted. A first-phase electrode 1011, a second-phase electrode 1012, and a third-phase electrode 1013 are fixed to the base 1080 with bolts 1070.

The first conductor portion 111 in the first current sensor 300, among the three current sensors 300, is connected to the first-phase electrode 1011. The first conductor portion 111 in the second current sensor 300, among the three current sensors 300, is connected to the second-phase electrode 1012. The first conductor portion 111 in the third current sensor 300, among the three current sensors 300, is connected to the third-phase electrode 1013.

The three current sensors 300 are spaced apart from each other in the height direction (the Z-axis direction). In adjacent current sensors 300, the area Ty between the first conductor portion 111 and the second conductor portion 112 in the width direction (the Y-axis direction) in one current sensor 300 is opposed to the third conductor portion 113 in the other current sensor 300. The housing 350 of the first current sensor 300 is opposed to the third conductor portion 113 in the second current sensor 300. The housing 350 of the second current sensor 300 is opposed to the third conductor portion 113 in the third current sensor 300.

In other words, in adjacent current sensors 300, the third conductor portion 113 in the other current sensor 300 is positioned at the other side in the height direction (the Z-axis direction) with respect to the first conductor portion 111 and the second conductor portion 112 in one current sensor 300, viewed from the length direction (the X-axis direction).

The strength of the magnetic field generated at the side of the surface of the third conductor portion 113, which is opposite to the surface adjacent to the first conductor portion 111 and the second conductor portion 112, is reduced in the above-described configuration. Accordingly, also with the above-described configuration of the current sensor module 1000, it is possible to reduce or prevent an occurrence of the difference in the value measured by the first current sensor 300 due to the magnetic field around the third conductor portion 113 in the second current sensor 300 and an occurrence of the difference in the value measured by the second current sensor 300 due to the magnetic field around the third conductor portion 113 in the third current sensor 300.

Figure 36:
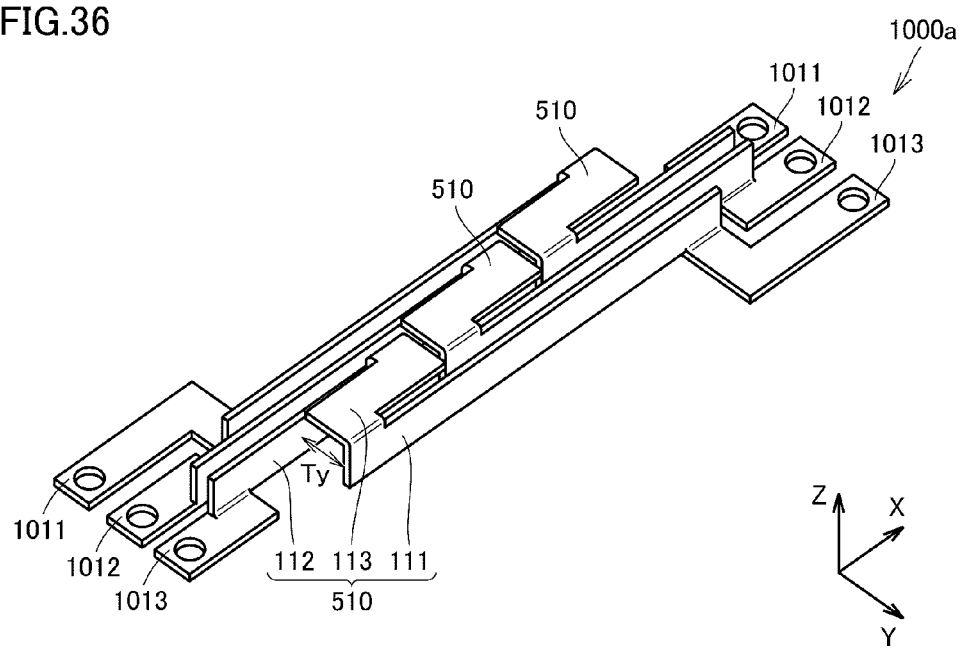
FIG. 36 is a perspective view illustrating how conductors are disposed in a current sensor module according to a modification of the tenth preferred embodiment of the present invention.

The disposition of the multiple current sensors is not limited to the one described above. FIG. 36 is a perspective view illustrating how conductors are disposed in a current sensor module according to a modification of the tenth preferred embodiment of the present invention. Only the conductors in the current sensor module are illustrated in FIG. 36.

As illustrated in FIG. 36, in a current sensor module 1000*a* according to the modification of the tenth preferred embodiment of the present invention, three conductors 510 are disposed so as to be parallel or substantially parallel to each other. The three conductors 510 are spaced apart from each other in the length direction (the X-axis direction) while being spaced from each other in the width direction (the Y-axis direction). In adjacent current sensors, the area Ty between the first conductor portion 111 and the second conductor portion 112 in the width direction (the Y-axis direction) in one current sensor is opposed in the length direction (the X-axis direction) to the area Ty between the first conductor portion 111 and the second conductor portion 112 in the width direction (the Y-axis direction) in the other current sensor.

The area Ty of one current sensor and the area Ty of the other current sensor are arranged in the length direction (the X-axis direction). Although the third conductor portion 113 in one current sensor and the third conductor portion 113 in the other current sensor are preferably positioned on the same or substantially the same plane in the present preferred embodiment, the positions of the third conductor portions 113 in the current sensors are not limited to this. The area Ty of one current sensor and the area Ty of the other current sensor may be positioned so as to be shifted from each other in the height direction (the Z-axis direction) within a range in which the area Ty of one current sensor and the area Ty of the other current sensor are opposed to each other in the length direction (the X-axis direction).

Also in the current sensor module 1000*a* according to the modification of the tenth preferred embodiment of the present invention, it is possible to reduce or prevent an occurrence of the difference in the value measured by the first current sensor 300 due to the magnetic field around the third conductor portion 113 in the second current sensor 300 and an occurrence of the difference in the value measured by the second current sensor 300 due to the magnetic field around the third conductor portion 113 in the third current sensor 300. In addition, since the three conductors 510 are capable of being disposed so as to be close to each other, it is possible to reduce the size of the current sensor module 1000*a*.

The components that are capable of being combined may be combined with each other in the description of the above-described preferred embodiments of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A current sensor comprising:
    a conductor through which current to be measured flows and which has dimensions in a length direction, a width direction orthogonal or substantially orthogonal to the length direction, and a height direction orthogonal or substantially orthogonal to the length direction and the width direction; and
    a first magnetic sensor and a second magnetic sensor that detect a strength of a magnetic field generated by the current; wherein
    the conductor includes:
        a first conductor portion that extends in the length direction and that includes a first end portion and a second end portion in the length direction;
        a second conductor portion that extends in the length direction and is spaced apart from the first conductor portion in the width direction and that includes a third end portion and a fourth end portion in the length direction; and
        a third conductor portion that is positioned between the first conductor portion and the second conductor portion, viewed from the height direction, that is positioned at one side of the height direction with respect to the first conductor portion and the second conductor portion, viewed from the length direction, and that includes a fifth end portion and a sixth end portion in the length direction;
    the sixth end portion is connected to the second end portion;
    the fifth end portion is connected to the third end portion; and
    each of the first magnetic sensor and the second magnetic sensor is positioned in an area between the first conductor portion and the second conductor portion in the width direction and an area including one end to another end in the height direction of both of the first conductor portion and the second conductor portion.

2. The current sensor according to claim 1, wherein
    a shortest distance between the first magnetic sensor and the first conductor portion is shorter than a shortest distance between the first magnetic sensor and the second conductor portion; and
    a shortest distance between the second magnetic sensor and the second conductor portion is shorter than a shortest distance between the second magnetic sensor and the first conductor portion.

3. The current sensor according to claim 2, wherein
    the shortest distance between the first magnetic sensor and the first conductor portion is shorter than a shortest distance between the first magnetic sensor and the third conductor portion; and
    the shortest distance between the second magnetic sensor and the second conductor portion is shorter than a shortest distance between the second magnetic sensor and the third conductor portion.

4. The current sensor according to claim 1, further comprising:
    a calculator that performs an arithmetic operation of a value detected by the first magnetic sensor and a value detected by the second magnetic sensor to calculate a value of the current; wherein
    a phase of a value of the magnetic field, detected by the first magnetic sensor, is opposite to a phase of a value of the magnetic field, detected by the second magnetic sensor; and
    the calculator is a subtractor or a differential amplifier.

5. The current sensor according to claim 1, further comprising:
    a calculator that performs an arithmetic operation of a value detected by the first magnetic sensor and a value detected by the second magnetic sensor to calculate a value of the current; wherein
    a value of the magnetic field, detected by the first magnetic sensor, is in phase with a value of the magnetic field, detected by the second magnetic sensor; and
    the calculator is an adder or a summing amplifier.

6. The current sensor according to claim 1, wherein
    each of the first conductor portion and the second conductor portion has a plate shape; and
    when viewed from the length direction, a first virtual plane including a surface of the first conductor portion at the second conductor portion side and a second virtual plane including a surface of the second conductor portion at the first conductor portion side are parallel or substantially parallel to each other.

7. The current sensor according to claim 1, wherein a portion of the first conductor portion and a portion of the second conductor portion are opposed to each other.

8. The current sensor according to claim 1, wherein, when viewed from the width direction, a position of the first conductor portion is shifted from a position of the second conductor portion in the height direction.

9. The current sensor according to claim 1, wherein
each of the first conductor portion and the second conductor portion has a plate shape; and
when viewed from the length direction, a first virtual plane including a surface of the first conductor portion at the second conductor portion side and a second virtual plane including a surface of the second conductor portion at the first conductor portion side intersect with each other.

10. The current sensor according to claim 1, wherein the third conductor portion extends in the length direction.

11. The current sensor according to claim 1, wherein the third conductor portion extends in the length direction and the width direction.

12. The current sensor according to claim 1, wherein the third conductor portion has a plate shape.

13. The current sensor according to claim 1, wherein, when viewed from the length direction, the third conductor portion is convexly bent toward a side opposite to the first conductor portion side in the height direction.

14. The current sensor according to claim 13, wherein the third conductor portion has a curved shape.

15. The current sensor according to claim 13, wherein the third conductor portion a flex shape.

16. The current sensor according to claim 1, further comprising:
a substrate on which the first magnetic sensor and the second magnetic sensor are mounted; and
a housing in which the substrate is housed; wherein
the housing is fixed to the conductor.

17. The current sensor according to claim 16, wherein the housing is in contact with the first conductor portion, the second conductor portion, and the third conductor portion.

18. A current sensor module comprising:
a plurality of the current sensors according to claim 1; wherein
the conductors of the respective plurality of current sensors are parallel or substantially parallel to each other.

19. The current sensor module according to claim 18, wherein
the plurality of current sensors are spaced apart from each other in the height direction; and
in adjacent current sensors of the plurality of current sensors, an area between the first conductor portion and the second conductor portion in the width direction in one of the adjacent current sensors is opposed to the third conductor portion in another of the adjacent current sensors.

20. The current sensor module according to claim 18, wherein
the plurality of current sensors are spaced apart from each other in the length direction and are spaced apart from each other in the width direction; and
in adjacent current sensors of the plurality of current sensors, an area between the first conductor portion and the second conductor portion in the width direction in one of the adjacent current sensors is opposed in the length direction to the area between the first conductor portion and the second conductor portion in the width direction in another of the adjacent current sensors.

* * * * *